United States Patent
Lam et al.

(10) Patent No.: US 10,425,080 B1
(45) Date of Patent: Sep. 24, 2019

(54) MAGNETIC PEAK CURRENT MODE CONTROL FOR RADIATION TOLERANT ACTIVE DRIVEN SYNCHRONOUS POWER CONVERTERS

(71) Applicant: Crane Electronics, Inc., Redmond, WA (US)

(72) Inventors: Cuon Lam, Renton, WA (US); Kai Liu, Redmond, WA (US); Herman Chen, Edmonds, WA (US); Sovann Song, Kent, WA (US); Khoa Nguyen, Seattle, WA (US)

(73) Assignee: Crane Electronics, Inc., Lynnwood, WA (US)

( * ) Notice: Subject to any disclaimer, the term of this patent is extended or adjusted under 35 U.S.C. 154(b) by 0 days.

(21) Appl. No.: 16/182,316

(22) Filed: Nov. 6, 2018

(51) Int. Cl.
*H03K 5/153* (2006.01)
*H03K 19/00* (2006.01)
(Continued)

(52) U.S. Cl.
CPC ......... *H03K 19/0016* (2013.01); *H01F 27/28* (2013.01); *H02M 3/33515* (2013.01); *H03K 5/1565* (2013.01); *H03K 7/08* (2013.01)

(58) Field of Classification Search
CPC ............. H03K 19/0016; H03K 5/1565; H03K 5/1532; H03K 7/08; H01F 27/28; H02M 3/33515; G01R 19/04
See application file for complete search history.

(56) References Cited

U.S. PATENT DOCUMENTS 3,144,627 A    8/1964  Dunnabeck et al.
3,201,728 A    8/1965  McWhirter
(Continued)

FOREIGN PATENT DOCUMENTS

CN    2307390 Y     2/1999
CN    101326705 A   12/2008
(Continued)

OTHER PUBLICATIONS

Chinese Office Action, dated Jan. 25, 2019, for Chinese Application No. 201680009468.4, 13 pages. (with English Translation).
(Continued)

*Primary Examiner* — Long Nguyen
(74) *Attorney, Agent, or Firm* — Seed IP Law Group LLP

(57) ABSTRACT

Systems and methods for providing peak current mode control (PCMC) for power converters using discrete analog components. A pair of complementary bipolar junction transistors may be used to set a maximum duty cycle for the power converter. PCMC may be achieved using a comparator that compares peak input current to an error feedback signal and terminates a pulse-width modulation (PWM) pulse when the peak input current exceeds the error feedback signal. A magnetic signal transformer may be used to establish a secondary side bias voltage supply, to return the error signal, and to drive an AC-coupled signal for a synchronous gate drive. A synchronous switch may be turned on when the main switch is turned off via an output winding of the flyback transformer and may be turned off by the trailing edge of a clock pulse from the magnetic signal transformer before the main switch is turned on.

24 Claims, 9 Drawing Sheets

(51) Int. Cl.
  *H03K 5/156* (2006.01)
  *H03K 7/08* (2006.01)
  *H01F 27/28* (2006.01)
  *H02M 3/335* (2006.01)

(56) References Cited

U.S. PATENT DOCUMENTS

| | | |
|---|---|---|
| 3,699,424 A | 10/1972 | Hart et al. |
| 3,831,080 A | 8/1974 | Zabert et al. |
| 3,886,433 A | 5/1975 | Watanabe |
| 4,128,868 A | 12/1978 | Gamble |
| 4,255,784 A | 3/1981 | Rosa |
| 4,337,569 A | 7/1982 | Pierce |
| 4,354,162 A | 10/1982 | Wright |
| 4,482,945 A | 11/1984 | Wolf et al. |
| 4,524,412 A | 6/1985 | Eng |
| 4,533,986 A | 8/1985 | Jones |
| 4,618,812 A | 10/1986 | Kawakami |
| 4,635,002 A | 1/1987 | Riebeek |
| 4,683,527 A | 7/1987 | Rosa |
| 4,719,552 A | 1/1988 | Albach et al. |
| 4,743,835 A | 5/1988 | Bossé et al. |
| 4,813,126 A | 3/1989 | Williamson |
| 4,814,735 A | 3/1989 | Williamson |
| 4,833,437 A | 5/1989 | Williamson |
| 4,837,535 A | 6/1989 | Konishi et al. |
| 4,920,309 A | 4/1990 | Szepesi |
| 4,956,626 A | 9/1990 | Hoppe et al. |
| 4,992,919 A | 2/1991 | Lee et al. |
| 5,031,066 A | 7/1991 | Wagner et al. |
| 5,068,774 A | 11/1991 | Rosa |
| 5,148,357 A | 9/1992 | Paice |
| 5,329,695 A | 7/1994 | Traskos et al. |
| 5,343,383 A | 8/1994 | Shinada et al. |
| 5,396,165 A | 3/1995 | Hwang et al. |
| 5,418,502 A | 5/1995 | Ma et al. |
| 5,430,640 A | 7/1995 | Lee |
| 5,436,550 A | 7/1995 | Arakawa |
| 5,469,124 A | 11/1995 | O'Donnell et al. |
| 5,481,225 A | 1/1996 | Lumsden et al. |
| 5,521,807 A | 5/1996 | Chen et al. |
| 5,631,822 A | 5/1997 | Silberkleit et al. |
| 5,638,262 A | 6/1997 | Brown |
| 5,691,629 A | 11/1997 | Belnap |
| 5,694,303 A | 12/1997 | Silberkleit et al. |
| 5,708,571 A | 1/1998 | Shinada |
| 5,734,563 A | 3/1998 | Shinada |
| 5,774,347 A | 6/1998 | Nakanishi |
| 5,777,866 A | 7/1998 | Jacobs et al. |
| 5,831,418 A | 11/1998 | Kitagawa |
| 5,903,504 A | 5/1999 | Chevallier et al. |
| 5,917,716 A | 6/1999 | Cho |
| 5,963,438 A | 10/1999 | Chen |
| 5,991,171 A | 11/1999 | Cheng |
| 6,002,183 A | 12/1999 | Iversen et al. |
| 6,002,318 A | 12/1999 | Werner et al. |
| 6,038,148 A | 3/2000 | Farrington et al. |
| 6,043,705 A | 3/2000 | Jiang |
| 6,091,616 A | 7/2000 | Jacobs et al. |
| 6,101,104 A | 8/2000 | Eng |
| 6,137,373 A | 10/2000 | Mori |
| 6,141,232 A | 10/2000 | Weinmeier et al. |
| 6,157,180 A | 12/2000 | Kuo |
| 6,157,282 A | 12/2000 | Hopkinson |
| 6,169,674 B1 | 1/2001 | Owen |
| 6,191,964 B1 | 2/2001 | Boylan et al. |
| 6,198,647 B1 | 3/2001 | Zhou et al. |
| 6,232,832 B1 | 5/2001 | Kirkpatrick, II |
| 6,236,194 B1 | 5/2001 | Manabe et al. |
| 6,252,781 B1 | 6/2001 | Rinne et al. |
| 6,304,463 B1 | 10/2001 | Krugly |
| 6,320,768 B1 | 11/2001 | Pham et al. |
| 6,335,872 B1 | 1/2002 | Zhou et al. |
| 6,343,026 B1 | 1/2002 | Perry |
| 6,426,884 B1 | 7/2002 | Sun |
| 6,456,511 B1 | 9/2002 | Wong |
| 6,469,478 B1 | 10/2002 | Curtin |
| 6,472,852 B1 | 10/2002 | Lethellier |
| 6,487,097 B2 | 11/2002 | Popescu |
| 6,490,183 B2 | 12/2002 | Zhang |
| 6,492,890 B1 | 12/2002 | Woznlczka |
| 6,496,395 B2 | 12/2002 | Tokunaga et al. |
| 6,545,534 B1 | 4/2003 | Mehr |
| 6,563,719 B1 | 5/2003 | Hua |
| 6,594,163 B2 | 7/2003 | Tsai |
| 6,617,948 B2 | 9/2003 | Kuroshima et al. |
| 6,618,274 B2 | 9/2003 | Boylan et al. |
| 6,643,151 B1 | 11/2003 | Nebrigic et al. |
| 6,664,660 B2 | 12/2003 | Tsai |
| 6,697,955 B1 | 2/2004 | Malik et al. |
| 6,707,650 B2 | 3/2004 | Diallo et al. |
| 6,711,039 B2 | 3/2004 | Brkovic |
| 6,734,775 B2 | 5/2004 | Chung |
| 6,760,235 B2 | 7/2004 | Lin et al. |
| 6,798,177 B1 | 9/2004 | Liu et al. |
| 6,839,246 B1 | 1/2005 | Zhang et al. |
| 6,850,048 B2 | 2/2005 | Orr et al. |
| 6,998,901 B2 | 2/2006 | Lee |
| 7,012,413 B1 | 3/2006 | Ye |
| 7,046,492 B2 | 5/2006 | Fromm et al. |
| 7,061,212 B2 | 6/2006 | Phadke |
| 7,095,215 B2 | 8/2006 | Liu et al. |
| 7,129,808 B2 | 10/2006 | Roebke et al. |
| 7,164,584 B2 | 1/2007 | Walz |
| 7,183,727 B2 | 2/2007 | Ferguson et al. |
| 7,199,563 B2 | 4/2007 | Ikezawa |
| 7,202,644 B2 | 4/2007 | Nitta et al. |
| 7,206,210 B2 | 4/2007 | Harnett et al. |
| 7,212,406 B2 | 5/2007 | Kaishian et al. |
| 7,224,590 B2 | 5/2007 | Lin |
| 7,227,754 B2 | 6/2007 | Griesinger et al. |
| 7,242,168 B2 | 7/2007 | Müller et al. |
| 7,286,376 B2 | 10/2007 | Yang |
| 7,304,828 B1 | 12/2007 | Shvartsman |
| 7,339,804 B2 | 3/2008 | Uchida |
| 7,369,024 B2 | 5/2008 | Yargole et al. |
| 7,443,278 B2 | 10/2008 | Kawahata et al. |
| 7,480,158 B2 | 1/2009 | Moromizato et al. |
| 7,515,005 B2 | 4/2009 | Dan |
| 7,564,706 B1 | 7/2009 | Herbert |
| 7,577,539 B2 | 8/2009 | Hubanks et al. |
| 7,579,901 B2 | 8/2009 | Yamashita |
| 7,589,982 B2 | 9/2009 | Wang et al. |
| 7,602,273 B2 | 10/2009 | Yoshikawa |
| 7,616,459 B2 | 11/2009 | Huynh et al. |
| 7,616,464 B2 | 11/2009 | Phadke et al. |
| 7,663,896 B2 | 2/2010 | Na |
| 7,730,981 B2 | 6/2010 | McCabe et al. |
| 7,742,318 B2 | 6/2010 | Fu et al. |
| 7,773,392 B2 | 8/2010 | Matsumoto |
| 7,786,712 B2 | 8/2010 | Williams |
| 7,847,519 B2 | 12/2010 | Ho |
| 7,884,317 B2 | 2/2011 | Casper |
| 7,893,804 B2 | 2/2011 | Kaveh Ahangar et al. |
| 7,933,131 B2 | 4/2011 | Cho et al. |
| 8,009,004 B2 | 8/2011 | Ahangar et al. |
| 8,040,699 B2 | 10/2011 | Huynh et al. |
| 8,067,992 B2 | 11/2011 | Chen et al. |
| 8,072,195 B2 | 12/2011 | Aan De Stegge et al. |
| 8,102,162 B2 | 1/2012 | Moussaoui et al. |
| 8,233,293 B2 | 7/2012 | Selvaraju et al. |
| 8,279,631 B2 | 10/2012 | Yang |
| 8,350,659 B2 | 1/2013 | Dziubek et al. |
| 8,358,118 B2 | 1/2013 | Chen et al. |
| 8,373,403 B1 | 2/2013 | Radovic |
| 8,378,647 B2 | 2/2013 | Yonezawa et al. |
| 8,508,195 B2 | 8/2013 | Uno |
| 8,520,415 B1 | 8/2013 | Krishnamoorthy et al. |
| 8,552,589 B2 | 10/2013 | Ghosh et al. |
| 8,570,006 B2 | 10/2013 | Moussaoui et al. |
| 8,649,128 B2 | 2/2014 | Wang et al. |
| 8,710,820 B2 | 4/2014 | Parker |
| 8,736,240 B2 | 5/2014 | Liu et al. |
| 8,760,082 B2 | 6/2014 | Yang et al. |

(56) References Cited

U.S. PATENT DOCUMENTS

| | | |
|---|---|---|
| 8,764,247 B2 | 7/2014 | Pattekar et al. |
| 8,810,214 B2 | 8/2014 | Van Dijk et al. |
| 8,824,167 B2 | 9/2014 | Hughes et al. |
| 8,829,868 B2 | 9/2014 | Waltman et al. |
| 8,866,551 B2 | 10/2014 | Lam et al. |
| 8,873,263 B2 | 10/2014 | Feng et al. |
| 8,885,308 B2 | 11/2014 | Waltman et al. |
| 8,890,630 B2 | 11/2014 | Hughes |
| 9,030,178 B2 | 5/2015 | Chang et al. |
| 9,041,378 B1 | 5/2015 | Lam et al. |
| 9,106,142 B2 | 8/2015 | Huang et al. |
| 9,160,228 B1 | 10/2015 | Parker et al. |
| 9,230,726 B1 | 1/2016 | Parker et al. |
| 9,293,999 B1 | 3/2016 | Lam et al. |
| 9,419,538 B2 | 8/2016 | Furmanczyk et al. |
| 9,654,013 B2 * | 5/2017 | Chen ................. H02M 3/33523 |
| 9,735,566 B1 | 8/2017 | Lam et al. |
| 9,742,183 B1 | 8/2017 | Lam et al. |
| 9,780,635 B1 | 10/2017 | Lam et al. |
| 9,831,768 B2 | 11/2017 | Lam et al. |
| 9,866,100 B2 | 1/2018 | Lam et al. |
| 9,888,568 B2 | 2/2018 | Parker et al. |
| 9,979,285 B1 * | 5/2018 | Lam ................. H02M 3/33507 |
| 2002/0015320 A1 | 2/2002 | Mochikawa et al. |
| 2002/0071300 A1 | 6/2002 | Jang et al. |
| 2003/0048644 A1 | 3/2003 | Nagai et al. |
| 2004/0125523 A1 | 7/2004 | Edwards et al. |
| 2004/0169498 A1 | 9/2004 | Goder et al. |
| 2004/0178776 A1 | 9/2004 | Hansen et al. |
| 2004/0178846 A1 | 9/2004 | Kuyel et al. |
| 2004/0207379 A1 | 10/2004 | Camara et al. |
| 2005/0122753 A1 | 6/2005 | Soldano |
| 2006/0039172 A1 | 2/2006 | Soldano |
| 2006/0071651 A1 | 4/2006 | Ito |
| 2006/0132105 A1 | 6/2006 | Prasad et al. |
| 2006/0132272 A1 | 6/2006 | Kitahara et al. |
| 2006/0208717 A1 | 9/2006 | Shimizu et al. |
| 2006/0212138 A1 | 9/2006 | Zhang |
| 2006/0220629 A1 | 10/2006 | Saito et al. |
| 2006/0227582 A1 | 10/2006 | Wei et al. |
| 2007/0152644 A1 | 7/2007 | Vinn |
| 2007/0257733 A1 | 11/2007 | Laletin |
| 2008/0024951 A1 | 1/2008 | Mortensen et al. |
| 2008/0031014 A1 | 2/2008 | Young |
| 2008/0111531 A1 | 5/2008 | Hasegawa et al. |
| 2008/0150670 A1 | 6/2008 | Chung et al. |
| 2008/0174396 A1 | 7/2008 | Choi et al. |
| 2008/0197724 A1 | 8/2008 | Cullen et al. |
| 2008/0303606 A1 | 12/2008 | Liu et al. |
| 2009/0067206 A1 | 3/2009 | Oguchi et al. |
| 2009/0128110 A1 | 5/2009 | DeLurio et al. |
| 2009/0154204 A1 | 6/2009 | Taylor |
| 2009/0167432 A1 | 7/2009 | van den Heuvel |
| 2009/0174381 A1 | 7/2009 | Ojanen et al. |
| 2009/0213623 A1 | 8/2009 | Yang |
| 2009/0231029 A1 | 9/2009 | Randlett |
| 2009/0237057 A1 | 9/2009 | Dishman et al. |
| 2009/0256547 A1 | 10/2009 | Akyildiz et al. |
| 2009/0273431 A1 | 11/2009 | Hurst |
| 2009/0295350 A1 | 12/2009 | Yamada |
| 2009/0302775 A1 | 12/2009 | Alexandrov |
| 2009/0321045 A1 | 12/2009 | Hernon et al. |
| 2009/0321046 A1 | 12/2009 | Hernon et al. |
| 2010/0008112 A1 | 1/2010 | Feng et al. |
| 2010/0014330 A1 | 1/2010 | Chang et al. |
| 2010/0117715 A1 | 5/2010 | Ariyama |
| 2010/0176755 A1 | 7/2010 | Hoadley et al. |
| 2010/0253309 A1 | 10/2010 | Xi et al. |
| 2010/0283442 A1 | 11/2010 | Nakashima |
| 2011/0090038 A1 | 4/2011 | Perchlik |
| 2011/0103105 A1 | 5/2011 | Wei et al. |
| 2011/0169471 A1 | 7/2011 | Nagasawa |
| 2011/0255315 A1 | 10/2011 | Ono |
| 2011/0317453 A1 | 12/2011 | Fan et al. |
| 2012/0268227 A1 | 10/2012 | Howes et al. |
| 2013/0021008 A1 | 1/2013 | Hume et al. |
| 2013/0049918 A1 | 2/2013 | Fu et al. |
| 2013/0121043 A1 | 5/2013 | Pietkiewicz |
| 2013/0245854 A1 | 9/2013 | Rinne et al. |
| 2013/0299148 A1 | 11/2013 | Hernon et al. |
| 2014/0015629 A1 | 1/2014 | Zeng et al. |
| 2014/0118946 A1 | 5/2014 | Tong et al. |
| 2014/0192561 A1 | 7/2014 | Plesnik |
| 2014/0254206 A1 | 9/2014 | Ou et al. |
| 2014/0292288 A1 | 10/2014 | Yan et al. |
| 2014/0327417 A1 | 11/2014 | Zhu et al. |
| 2015/0137412 A1 | 5/2015 | Schalansky |
| 2015/0229149 A1 | 8/2015 | Fahlenkamp et al. |
| 2016/0190948 A1 | 6/2016 | Yang et al. |
| 2016/0237790 A1 | 8/2016 | Williams |

FOREIGN PATENT DOCUMENTS

| | | |
|---|---|---|
| CN | 101334253 A | 12/2008 |
| CN | 201219235 Y | 4/2009 |
| CN | 201430054 Y | 3/2010 |
| CN | 103051184 A | 4/2013 |
| CN | 103414334 A | 11/2013 |
| CN | 103582997 A | 2/2014 |
| CN | 103596343 A | 2/2014 |
| CN | 104704742 A | 6/2015 |
| EP | 1 933 340 A1 | 6/2008 |
| GB | 1071469 A | 6/1967 |
| GB | 1114013 A | 5/1968 |
| JP | 55-1761 A | 1/1980 |
| JP | 55-130208 A | 10/1980 |
| JP | 62-32714 A | 2/1987 |
| JP | 2567069 B2 | 6/1993 |
| JP | 8-78252 A | 3/1996 |
| JP | 2001-32050 A | 11/2001 |
| JP | 2002-76799 A | 3/2002 |
| JP | 2002-335674 A | 11/2002 |
| JP | 2003-173913 A | 6/2003 |
| JP | 2007-215359 A | 8/2007 |
| JP | 2007-263944 A | 10/2007 |
| JP | 2008-185398 A | 8/2008 |
| JP | 2009-81952 A | 4/2009 |
| JP | 2009-100120 A | 5/2009 |
| JP | 2009-106012 A | 5/2009 |
| JP | 5030216 B2 | 9/2012 |
| KR | 10-2007-0118409 A | 12/2007 |
| KR | 10-2008-0019196 A | 3/2008 |
| KR | 10-2008-0101784 A | 11/2008 |
| KR | 10-2009-0075465 A | 7/2009 |
| KR | 10-2013-0026714 A | 3/2016 |
| TW | 201331967 A1 | 8/2013 |
| WO | 99/41957 A1 | 8/1999 |
| WO | 01/22444 A1 | 3/2001 |
| WO | 02/097974 A2 | 12/2002 |
| WO | 2011/123680 A2 | 10/2011 |
| WO | 2012/100810 A1 | 8/2012 |
| WO | 2012/116263 A1 | 8/2012 |
| WO | 2014/039982 A1 | 3/2014 |
| WO | 2014/103298 A1 | 7/2014 |
| WO | 2014/152415 A1 | 9/2014 |
| WO | 2017/015143 A1 | 1/2017 |

OTHER PUBLICATIONS

Taiwanese Office Action, dated Dec. 26, 2018, for Taiwanese Application No. 105105051, 11 pages. (with English Translation).
"Application Guide: Theory of Operation," MicroPower Direct, retrieved from http://micropowerdirect.com/PDF%20Filed/Application%20Notes/Power%20Supply%20Theory%20of%20Operation.pdf on Apr. 18, 2012, 6 pages.
"Buck converter," retrieved from http://en.wikipedia.org/wiki/Buck_converter, on Jun. 23, 2011, 14 pages.
"EMI Suppression Filters (EMIFIL®) for AC Power Lines," Murata Manufacturing Co., Ltd., Cat.No. C09E-14, downloaded on Feb. 21, 2014, 27 pages.
"Maximum Flexible Power (MFP) Single Output Point of Load: Technical Preview—3—6 VDC IN, 7 AMP, Non-Isolated DC/DC

(56) References Cited

OTHER PUBLICATIONS

Converter," Crane Aerospace & Electronics Power Solutions, 2010, 17 pages.
"Step-gap "E" core swing chokes: Improved regulation and higher efficiency are possible when operating at minimum current levels," Technical Bulletin: BULLETIN FC-S4, Magnetics Division, Spang & Company, Butler, Pennsylvania, 2001, 4 pages.
"Synchronous Rectification Aids Low-Voltage Power Supplies," Maxim Integrated Products, retrieved from http://www.maxim-ic.com/app-notes/index.mvp/id/652, on Jun. 22, 2011, 6 pages.
"Application Note 664 Feedback Isolation Augments Power-Supply Safety and Performance," Maxim Integrated, Jan. 22, 2001, retrieved from https://www.maximintegrated.com/en/app-notes/index.mvp/id/664, 6 pages.
Advisory Action, dated Aug. 14, 2017, for U.S. Appl. No. 14/787,565, Lam et al., "Dynamic Maneuvering Configuration for Multiple Control Modes in a Unified Servo System," 3 pages.
Amendment, filed Dec. 16, 2016, for U.S. Appl. No. 14/787,565, Lam et al., "Dynamic Maneuvering Configuration for Multiple Control Modes in a Unified Servo System," 10 pages.
Amendment, filed Jul. 14, 2017, for U.S. Application No. 15/178,968, Lam et al., "Dynamic Sharing Average Current Mode Control for Active-Reset and Self-Driven Synchronous Rectification for Power Converters," 11 pages.
Amendment, filed Jul. 24, 2017, for U.S. Appl. No. 14/787,565, Lam et al., "Dynamic Maneuvering Configuration for Multiple Control Modes in a Unified Servo System," 9 pages.
Amendment, filed Mar. 20, 2017, for U.S. Appl. No. 15/374,116, Lam et al., "Proactively Operational Over-Voltage Protection Circuit," 3 pages.
Amendment, filed Mar. 20, 2017, for U.S. Appl. No. 15/376,329, Lam et al., "Proactively Operational Over-Voltage Protection Circuit," 2 pages.
Beta Dyne, "Synchronous Rectification," Application Note DC-006, DC/DC Converters, 2002, 3 pages.
Bottrill, "The Effects of Turning off a Converter with Self-Driven Synchronous Rectifiers," Power Guru, May 1, 2007, retrieved from http://www.powerguru.org/the-effects-of-turning-off-a-converter-with-self-driven-synchronous-rectifiers/ Jul. 10, 2015, 6 pages.
Chinese Office Action with English Translation dated May 22, 2015, for corresponding CN Application No. 201280016631.1, 15 pages.
Chinese Office Action, dated Jan. 17, 2018, for Chinese Application No. 201580049344.4, 5 pages.
Chinese Office Action, dated Jul. 17, 2018, for Chinese Application No. 201680009468.4, 20 pages. (with English Translation).
Chinese Office Action, dated Jul. 24, 2018, for Chinese Application No. 201611107294.3, 9 pages. (with English Translation).
Coates, "Power supplies—3.0 Switched Mode Power Supplies," www.learnabout-electronics.org, 2007-2013, 20 pages.
Cuon et al., "Dynamic Maneuvering Configuration of Multiple Control Modes in a Unified Servo System," Amendment filed Mar. 6, 2015, for U.S. Appl. No. 14/333,705, 11 pages.
Dixon, "Unitrode Application Note Average Current Mode Control of Switching Power Supplies," Texas Instruments Inc., 1999.
ECircuit Center, "Op Amp Input Offset Adjustment," 2002, retrieved from http://www.ecircuitcenter.com/Circuits/op_voff/op_voff2.htm on Mar. 26, 2012, 3 pages.
Erickson et al., *Fundamentals of Power Electronics*, Kluwer Academic Publishers, New York City, New York, USA, 2004, Chapter 12, "Current Programmed Control," pp. 439-482. (46 pages).
European Search Report, dated Jul. 5, 2017, for EP Application No. 15822324.8-1804 / 3170057, 11 pages.
Extended European Search Report, dated Apr. 15, 2016 for corresponding European Application No. 13835620.9, 7 pages.
Extended European Search Report, dated Dec. 14, 2017 for European Application No. 12750065.0-1809, 8 pages.
Extended European Search Report, dated Jan. 4, 2019, for European Application No. 18201073.6-1202, 9 pages.

Final Office Action, dated Apr. 27, 2017, for U.S. Appl. No. 14/787,565, Lam et al., "Dynamic Maneuvering Configuration for Multiple Control Modes in a Unified Servo System," 10 pages.
Final Office Action, dated Jun. 1, 2017, for U.S. Appl. No. 15/178,968, Lam et al., "Dynamic Sharing Average Current Mode Control for Active Reset and Self-Driven Synchronous Rectification for Power Converters," 16 pages.
Furmanczyk et al., "AC/DC Power Conversion System and Method of Manufacture of the Same," Notice of Allowance, dated Apr. 25, 2016, for U.S. Appl. No. 14/001,312, 9 pages.
Garcia et al., "Optimal Design for Natural Convection-Cooled Rectifiers," *18th International Telecommunications Energy Conference*, Boston, Oct. 6-10, 1996, 10 pages.
Hughes et al., "Self Synchronizing Power Converter Apparatus and Method Suitable for Auxiliary Bias for Dynamic Load Applications," Notice of Allowance dated May 14, 2014, for U.S. Appl. No. 13/185,217, 10 pages.
Hughes, "Oscillator Apparatus and Method With Wide Adjustable Frequency Range," Amendment filed Apr. 24, 2014, for U.S. Appl. No. 13/185,152, 8 pages.
Hughes, "Oscillator Apparatus and Method With Wide Adjustable Frequency Range," Amendment filed Oct. 7, 2013, for U.S. Appl. No. 13/185,152, 15 pages.
Hughes, "Oscillator Apparatus and Method With Wide Adjustable Frequency Range," Notice of Allowance dated Jul. 14, 2014, for U.S. Appl. No. 13/185,152, 12 pages.
Hughes, "Oscillator Apparatus and Method With Wide Adjustable Frequency Range," Office Action dated Jan. 28, 2014, for U.S. Appl. No. 13/185,152, 15 pages.
Hughes, "Oscillator Apparatus and Method With Wide Adjustable Frequency Range," Office Action dated Jun. 5, 2013, for U.S. Appl. No. 13/185,152, 17 pages.
Hume et al., "Power Converter Apparatus and Method With Compensation for Light Load Conditions," Office Action dated Nov. 6, 2013, for U.S. Appl. No. 13/185,142, 11 pages.
International Search Report and Written Opinion of the International Searching Authority, dated Aug. 31, 2015 for corresponding International Application No. PCT/US2015/033321, 9 pages (417WO).
International Search Report and Written Opinion of the International Searching Authority, dated Jun. 21, 2016, for corresponding International Application No. PCT/US2013/019520, 14 pages.
International Search Report and Written Opinion of the International Searching Authority, dated May 31, 2016, for corresponding International Application No. PCT/US2016/018628, 12 pages.
International Search Report and Written Opinion, dated Aug. 18, 2017, for International Application No. PCT/US2017/035932, 12 pages.
International Search Report and Written Opinion, dated Oct. 12, 2016, for corresponding International Application No. PCT/US2016/042582, 11 pages.
International Search Report, dated Aug. 12, 2002, for PCT/US01/50033, 1 pages.
International Search Report, dated Dec. 20, 2013, for PCT/US2013/058784, 3 pages.
International Search Report, dated Jun. 8, 2011, for PCT/US2010/052705, 5 pages.
International Search Report, dated Jun. 8, 2011, for PCT/US2010/052707, 5 pages.
International Search Report, dated Oct. 14, 2011, for PCT/US2011/030778, 3 pages.
Irving et al., "Analysis and Design Optimization of Magnetic-Feedback Control Using Amplitude Modulation," *IEEE Transactions on Power Electronics* 24(2):426-433, Feb. 2009.
Jovanović et al., "Design Considerations for Forward Converter with Synchronous Rectifiers," Power Conversion Proceedings, pp. 340-350, Oct. 1993.
King et al., "Active Clamp Control Boosts Forward Converter Efficiency," Power Electronics Technology, pp. 52-55, Jun. 2003.
Kristjansson et al., "Solutions to Today's Low Voltage Power Design Challenges Using High-Efficiency, Non-Isolated Point of Load Converters: A Discussion of the Interpoint™ MFP Series™

(56) References Cited

OTHER PUBLICATIONS

Point of Load Converter," Crane Aerospace & Electronics, Power Solutions—Interpoint Products, Redmond, WA, Oct. 2011, Revised Jan. 2012, 25 pages.

Kuehny et al., "Output Filter for Use With Power Converters, for Example DC/DC Power Converters, for Instance Interpoint MFP POL DC/DC Power Converters," U.S. Appl. No. 61/547,327, filed Oct. 14, 2011, 14 pages.

Lam et al., "Automatic Enhanced Self-Driven Synchronous Rectification for Power Converters for Wide Input Range and High Output Voltage Without Tertiary Winding," U.S. Appl. No. 62/193,755, filed Jul. 17, 2015, 53 pages.

Lam et al., "Automatic Enhanced Self-Driven Synchronous Rectification for Power Converters," Notice of Allowance, for U.S. Appl. No. 14/848,859, dated Dec. 10, 2015, 29 pages.

Lam et al., "Dynamic Maneuvering Configuration for Multiple Control Modes in a Unified Servo System," Office Action dated Dec. 23, 2014, for U.S. Appl. No. 14/333,705, 6 pages.

Lam et al., "Dynamic Sharing Average Current Mode Control for Active-Reset and Self-Driven Synchronous Rectification for Power Converters," Amendment filed Feb. 15, 2017 for U.S. Appl. No. 15/178,968, 22 pages.

Lam et al., "Impedance Compensation for Operational Amplifiers Used in Variable Environments," Amendment filed May 6, 2014, for U.S. Appl. No. 13/609,107, 12 pages.

Lam et al., "Impedance Compensation for Operational Amplifiers Used in Variable Environments," Notice of Allowance dated Jun. 27, 2014, for U.S. Appl. No. 13/609,107, 9 pages.

Lam et al., "Impedance Compensation for Operational Amplifiers Used in Variable Environments," Office Action dated Feb. 7, 2014, for U.S. Appl. No. 13/609,107, 11 pages.

Manfredi et al., "Additive Manufacturing of Al Alloys and Aluminium Matrix Composites (AMCs)," in Monteiro (ed.), *Light Metal Alloys Applications*, InTech, Jun. 11, 2014, 32 pages.

Mappus, "Synchronous Rectification for Forward Converters," Fairchild Semiconductor Power Seminar 2010-2011, 19 pages.

Merriam-Webster, "Directly," retrieved from http://www.merriam-webster.com/dictionary/directly, on Nov. 6, 2012, 1 pages.

Mitsuya, "Basics of Noise Countermeasures—Lesson 14: Using Common Mode Choke Coils for Power Supply Lines," Murata Manufacturing Co., Ltd., Oct. 28, 2014, retrieved on Feb. 4, 2015, from http://www.murata.com/en-eu/products/emiconfun/emc/2014/10/28/en-20141028-pl, 3 pages.

Ng, "Implementing Constant Current Constant Voltage AC Adapter by NCP1200 and NCP4300A," Application Note, Publication Order No. AND8042/D, Semiconductor Components Industries, Feb. 2001, 12 pages.

Nguyen et al., "Nulling Input Offset Voltage of Operational Amplifiers," Mixed Signal Products, Texas Instruments—Application Report SLOA045, Aug. 2000, pp. 1-15.

Notice for Reasons for Rejections from the Japanese Patent Office with English Translation, dated Apr. 18, 2016, for corresponding Japanese Application No. 2015-531290, 5 pages.

Notice of Allowance dated Apr. 20, 2017 for Lam et al., "Proactively Operational Over-Voltage Protection Circuit," U.S Appl. No. 15/376,329, 8 pages.

Notice of Allowance dated Apr. 24, 2017 for Lam et al., "Proactively Operational Over-Voltage Protection Circuit," U.S. Appl. No. 15/374,116, 9 pages.

Notice of Allowance, dated Jul. 28, 2017, for U.S. Appl. No. 15/178,968, Lam et al., "Dynamic Sharing Average Current Mode Control for Active Reset and Self-Driven Synchronous Rectification for Power Converters," 5 pages.

Notice of Allowance, dated Mar. 1, 2018, for U.S. Appl. No. 15/786,368, Lam et al., "Radiation Tolerant, Analog Latch Peak Current Mode Control for Power Converters," 37 pages.

Notice of Allowance, dated Mar. 15, 2018, for U.S. Appl. No. 15/786,368, Lam et al., "Radiation Tolerant, Analog Latch Peak Current Mode Control for Power Converters," 3 pages.

Notice of Allowance, dated Nov. 16, 2017, for U.S. Appl. No. 15/652,849, Lam et al., "Dynamic Sharing Average Current Mode Control for Active-Reset and Self-Driven Synchronous Rectification for Power Converters," 10 pages.

Notice of Allowance, dated Sep. 25, 2017, for U.S. Appl. No. 14/787,565, Lam et al., "Dynamic Maneuvering Configuration for Multiple Control Modes in a Unified Servo System," 5 pages.

Office Action dated Nov. 18, 2016 for U.S. Appl. No. 15/178,968, Lam et al., "Dynamic Sharing Average Current Mode Control for Active-Reset and Self-Driven Synchronous Rectification for Power Converters,"20 pages.

Office Action, dated Mar. 15, 2017, for U.S. Appl. No. 15/374,116, Lam et al., "Proactively Operational Over-Voltage Protection Circuit," 6 pages.

Office Action, dated Mar. 7, 2017, for U.S. Appl. No. 15/376,329, Lam et al., "Proactively Operational Over-Voltage Protection Circuit," 6 pages.

Office Action, dated Sep. 19, 2016, for U.S. Appl. No. 14/787,565, Lam et al., "Dynamic Maneuvering Configuration for Multiple Control Modes in a Unified Servo System," 9 pages.

Ou et al., "Magnetic Feedback Ranks High in Military Converters," Power Electronics Technology: Jul. 14-19, 2005.

Parker et al., "Integrated Tri-State Electromagnetic Interference Filter and Line Conditioning Module," Office Action dated Apr. 24, 2015, for U.S. 14/632,818, 11 pages.

Parker et al., "Transformer-Based Power Converters With 3D Printed Microchannel Heat Sink," Office Action dated Apr. 16, 2015, for U.S. Appl. No. 14/627,556, 9 pages.

Parker et al., "Transformer-Based Power Converters With 3D Printed Microchannel Heat Sink," Office Action, dated Aug. 3, 2015, for U.S. Appl. No. 14/627,556, 11 pages.

Parker, "Switched Capacitor Hold-Up Scheme for Constant Boost Output Voltage," Amendment filed Feb. 15, 2013, for U.S. Appl. No. 12/751,067, 15 pages.

Parker, "Switched Capacitor Hold-Up Scheme for Constant Boost Output Voltage," Amendment filed Jan. 16, 2013, for U.S. Appl. No. 12/751,067, 15 pages.

Parker, "Switched Capacitor Hold-Up Scheme for Constant Boost Output Voltage," Amendment filed Jul. 30, 2012, for U.S. Appl. No. 12/751,067, 18 pages.

Parker, "Switched Capacitor Hold-Up Scheme for Constant Boost Output Voltage," Amendment filed Oct. 30, 2013, for U.S. Appl. No. 12/751,067, 19 pages.

Parker, "Switched Capacitor Hold-Up Scheme for Constant Boost Output Voltage," Notice of Allowance dated Feb. 3, 2014, for U.S. Appl. No. 12/751,067, 11 pages.

Parker, "Switched Capacitor Hold-Up Scheme for Constant Boost Output Voltage," Office Action dated Jul. 30, 2013, for U.S. Appl. No. 12/751,067, 18 pages.

Parker, "Switched Capacitor Hold-Up Scheme for Constant Boost Output Voltage," Office Action dated Mar. 28, 2012, for U.S. Appl. No. 12/751,067, 16 pages.

Parker, "Switched Capacitor Hold-Up Scheme for Constant Boost Output Voltage," Office Action mailed Nov. 16, 2012, for U.S. Appl. No. 12/751,067, 20 pages.

Pascu, "Error Amplifier with Forced Equilibrium Adaptor," Kepco, Inc., retrieved from http://www.kepcopower.com/equibm2.htm#fig2, dated May 22, 2014, 8 pages.

Peter, "Synchronous rectifier in DC/DC converters," Oct. 5, 2009, retrieved from http://www.posterus.sk/?p=2535, on Jul. 10, 2015, 11 pages.

Plesnik, "A New Method for Driving Synchronous Rectifiers," IEICE/IEEE INTELEC'03, Oct. 19-23, Yokohama, Japan, pp. 274-281, 2003.

Preliminary Amendment, filed Oct. 28, 2015, for U.S. Appl. No. 14/787,565, Lam et al., "Dynamic Maneuvering Configuration for Multiple Control Modes in a Unified Servo System," 6 pages.

Rubasinghe, "Use an op amp as a set/reset flip-flop," EDN:45-46, 2012.

Shrisavar, "Introduction to Power Management," Texas Instruments, Biracha Digital Power Ltd., 2014, 37 pages.

(56) References Cited

OTHER PUBLICATIONS

Supplemental Notice of Allowability, dated Nov. 1, 2017, for U.S. Appl. No. 14/787,565, Lam et al., "Dynamic Maneuvering Configuration for Multiple Control Modes in a Unified Servo System," 3 pages.
Texas Instruments, "AN-72 The LM3900: A New Current-Differencing Quad of Plus of Minus Input Amplifiers," Lit. No. SNOA653, May 2, 2004, 48 pages.
Voltage Comparator Information and Circuits, Feb. 26, 2015, URL= http://home.cogeco.ca/~rpaisley4/Comparators.html, download date Jun. 7, 2017, 22 pages.
Waltman et al., "Input Control Apparatus and Method With Inrush Current, Under and Over Voltage Handling," Office Action dated Jun. 17, 2014, for U.S. Appl. No. 13/185,210, 8 pages.
Waltman et al., "Power Converter Apparatus and Method With Compensation for Current Limit/Current Share Operation," Amendment filed Mar. 17, 2014, for U.S. Appl. No. 13/185,172, 16 pages.
Waltman et al., "Power Converter Apparatus and Method With Compensation for Current Limit/Current Share Operation," Notice of Allowance dated May 8, 2014, for U.S. Appl. No. 13/185,172, 10 pages.
Waltman et al., "Power Converter Apparatus and Method With Compensation for Current Limit/Current Share Operation," Office Action dated Dec. 17, 2013, for U.S. Appl. No. 13/185,172, 15 pages.
Waltman et al., "Power Converter Apparatus and Methods," U.S. Appl. No. 61/508,937, filed Jul. 18, 2011, 139 pages.
West, "Analogue Set-Reset Latch," *Electronics Today International* 7(11):76, 1983.
Written Opinion, dated Dec. 20, 2013, for PCT/US2013/058784, 4 pages.
Written Opinion, dated Oct. 14, 2011, for PCT/US2011/030778, 5 pages.
Xing et al., "Power System Architecture with Back-Up Power for Servers," ERC Program of the National Science Foundation, 5 pages. (The year of publication is sufficiently earlier than the effective U.S. filing date and any foreign priority date so that the particular month of publication is not in issue.).
Zhang, "Chapter Two Synchronous Rectification," Synchronous Rectification, pp. 9-72, PDF created Feb. 20, 1997.

* cited by examiner

MAGNETIC PEAK CURRENT MODE CONTROL FOR RADIATION TOLERANT ACTIVE DRIVEN SYNCHRONOUS POWER CONVERTERS

BACKGROUND

Technical Field

The present disclosure generally relates to controllers for power converters.

Description of the Related Art

DC/DC converters are a type of power supply which converts an input DC voltage to a different output DC voltage. Such converters typically include a transformer that is electrically coupled via a switching circuit between a voltage source and a load. Converters known as forward converters include at least one main switch connected between the voltage source and the primary winding of the transformer to provide forward power transfer to the secondary winding of the transformer when the switch is on and conducting. A metal oxide semiconductor field effect transistor (MOSFET) device is typically used for the one or more main switches.

Power converter designs are often constrained by various requirements, such as efficiency, input voltage range, output voltage, power density, and footprint area. These constraints require certain performance tradeoffs. For instance, achieving higher efficiencies may require a more narrow input voltage range. To further improve efficiencies, active-reset schemes and synchronous rectifications are often employed. These synchronous rectification schemes can either be active-control or self-driven.

Environments with high levels of ionizing radiation create special design challenges. A single charged particle can knock thousands of electrons loose, causing electronic noise and signal spikes. In the case of digital circuits, this can cause results which are inaccurate or unintelligible. This can be a particularly serious problem in the design of components for satellites, spacecraft, aircraft, power stations, etc.

BRIEF SUMMARY

A peak current mode control (PCMC) controller for a power converter, the power converter including a main transformer having a primary winding and a secondary winding, the primary winding electrically coupleable to an input voltage node and electrically coupled to a main switch, the secondary winding electrically coupleable to an output voltage node and electrically coupled to a synchronous rectifier switch, may be summarized as including a peak current detector circuit having a first input node operatively coupled to a current sensor circuit that, in operation, senses a current of the power converter, a second input node operatively coupled to an error control signal circuit, and an output node that provides a peak current detector output signal usable at least in part to control the operation of the main switch, in operation the peak current detector circuit compares a current sensor signal received from the current sensor circuit to an error control signal received from the error control signal circuit and, responsive to detecting that the current sensor signal exceeds the error control signal, changes the state of the peak current detector output signal; a magnetic isolator circuit including an isolation transformer including a primary winding and a secondary winding, the magnetic isolator circuit including a first input node operatively coupled to the error control signal circuit, a second input node operatively coupled to a clock circuit to receive a clock signal therefrom, a first output node electrically coupled to the second input node of the peak current detector circuit to provide the error control signal to the peak current detector circuit, and a second output node electrically coupled to the secondary winding of the isolation transformer; and a synchronous gate drive circuit including a first input node operatively coupled to the secondary winding of the main transformer, a second input node operatively coupled to the second output node of the magnetic isolator circuit, and an output node operatively coupled to control the operation of the synchronous rectifier switch.

The peak current detector circuit may include a comparator and the synchronous gate drive circuit may include a MOSFET driver. The magnetic isolator circuit may include circuitry that provides a voltage source for the secondary side circuit of the PCMC controller. The PCMC controller may further include a time delayed gate drive circuit including a first input node operatively coupled to the clock circuit to receive the clock signal therefrom, a second input node operatively coupled to the output node of the peak current detector circuit, and an output node operatively coupled to control the operation of the main switch based at least in part on the clock signal and the peak current detector output signal, in operation, the time delayed gate drive circuit may cause main switch to turn on only after the synchronous rectifier switch has turned off during a switching cycle. The time delayed gate drive circuit may include a resistor-capacitor (RC) circuit. The time delayed gate drive circuit may include a MOSFET gate driver. The PCMC controller may further include a preset maximum duty cycle circuit including an input node operatively coupled to the clock circuit to receive the clock signal therefrom, and an output node operatively coupled to the second input node of the time delayed gate drive circuit, in operation, the present maximum duty cycle may set a maximum duty cycle for the main switch of the power converter. The preset maximum duty cycle circuit may include first and second complementing bipolar junction transistors. The magnetic isolator circuit may include a magnetic isolator circuit switch operatively coupled to the primary winding of the isolation transformer, and wherein the second input node of the magnetic isolator circuit may be operatively coupled to control the operation of the synchronous rectifier switch. The synchronous gate drive circuit may be operative to cause the synchronous rectifier switch to turn on after the main switch turns off each cycle, and to cause the synchronous rectifier switch to turn off before the main switch turns on during a subsequent cycle. The PCMC controller may further include the current sensor circuit including a current transducer that, in operation, senses a current of the power converter. The current transducer may include a transformer or a resistor.

A power converter may be summarized as including a transformer having a primary winding and a secondary winding, the primary winding electrically coupleable to an input voltage node and the secondary winding electrically coupleable to an output voltage node; a primary circuit electrically coupled to the primary winding, the primary circuit including a main switch; a secondary circuit electrically coupled to the secondary winding, the primary circuit including a synchronous rectifier switch; and a peak current mode control (PCMC) controller, including: a peak current detector circuit having a first input node operatively coupled to a current sensor circuit that, in operation, senses a current of the power converter, a second input node operatively coupled to an error control signal circuit, and an output node that provides a peak current detector output signal usable at least in part to control the operation of the main switch, in operation the peak current detector circuit compares a current sensor signal received from the current sensor circuit to an error control signal received from the error control signal circuit and, responsive to detecting that the current sensor signal exceeds the error control signal, changes the state of the peak current detector output signal; a magnetic isolator circuit including an isolation transformer including a primary winding and a secondary winding, the magnetic isolator circuit including a first input node operatively coupled to the error control signal circuit, a second input node operatively coupled to a clock circuit to receive a clock signal therefrom, a first output node electrically coupled to the second input node of the peak current detector circuit to provide the error control signal to the peak current detector circuit, and a second output node electrically coupled to the secondary winding of the isolation transformer; and a synchronous gate drive circuit including a first input node operatively coupled to the secondary winding of the main transformer, a second input node operatively coupled to the second output node of the magnetic isolator circuit, and an output node operatively coupled to control the operation of the synchronous rectifier switch.

The peak current detector circuit may include a comparator and the synchronous gate drive circuit may include a MOSFET driver. The magnetic isolator circuit may include circuitry that provides a voltage source for the secondary side of the PCMC controller. The power converter may further include a time delayed gate drive circuit including a first input node operatively coupled to the clock circuit to receive the clock signal therefrom, a second input node operatively coupled to the output node of the peak current detector circuit, and an output node operatively coupled to control the operation of the main switch based at least in part on the clock signal and the peak current detector output signal, in operation, the time delayed gate drive circuit may cause main switch to turn on only after the synchronous rectifier switch has turned off during a switching cycle. The time delayed gate drive circuit may include a resistor-capacitor (RC) circuit. The power converter may further include a preset maximum duty cycle circuit may include an input node operatively coupled to the clock circuit to receive the clock signal therefrom, and an output node operatively coupled to the second input node of the time delayed gate drive circuit, in operation, the present maximum duty cycle may set a maximum duty cycle for the main switch of the power converter. The preset maximum duty cycle circuit may include first and second complementing bipolar junction transistors. The magnetic isolator circuit may include a magnetic isolator circuit switch operatively coupled to the primary winding of the isolation transformer, and wherein the second input node of the magnetic isolator circuit may be operatively coupled to control the operation of the synchronous rectifier switch. The synchronous gate drive circuit may be operative to cause the synchronous rectifier switch to turn on after the main switch turns off each cycle, and may cause the synchronous rectifier switch to turn off before the main switch turns on for a subsequent cycle. The power converter may further include the current sensor circuit including a current transducer that, in operation, senses a current of the power converter. The current transducer may include a transformer or a resistor.

A peak current mode control (PCMC) controller for a power converter, the power converter including a main transformer having a primary winding and a secondary winding, the primary winding electrically coupleable to an input voltage node and electrically coupled to a main switch, the secondary winding electrically coupleable to an output voltage node and electrically coupled to a synchronous rectifier switch may be summarized as including: a magnetic isolator circuit including an isolation transformer including a primary winding electrically coupled to a primary side circuit and a secondary winding electrically coupled to a secondary side circuit, the magnetic isolator circuit including circuitry that, in operation, provides a voltage supply to the secondary side circuit, provides an error control signal from the secondary side circuit to the primary side circuit, and provides an output signal usable by a synchronous gate drive circuit to control the operation of the synchronous rectifier switch.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

One or more implementations of the present disclosure provide peak current mode control (PCMC) circuitry for power converters using discrete analog components. As discussed further below with reference to the figures, one or more implementations of the present disclosure provide radiation tolerant, high efficiency, ultra-wide input DC-DC converters for various applications (e.g., space applications). In at least some implementations, control circuitry enables an ultra-wide input range converter of at least a 6:1 input range ratio and provides an efficiency that is 90% or greater, for example. In at least some implementations, a pulse-width modulation (PWM) controller is provided that implements synchronous rectification timing control, via two magnetic components (e.g., flyback transformer, multifunctional isolator or isolation transformer), and analog latch peak current mode control using discrete analog components, which provides a synchronous flyback converter that has higher efficiency and a wider input voltage range.

Figure 1A:
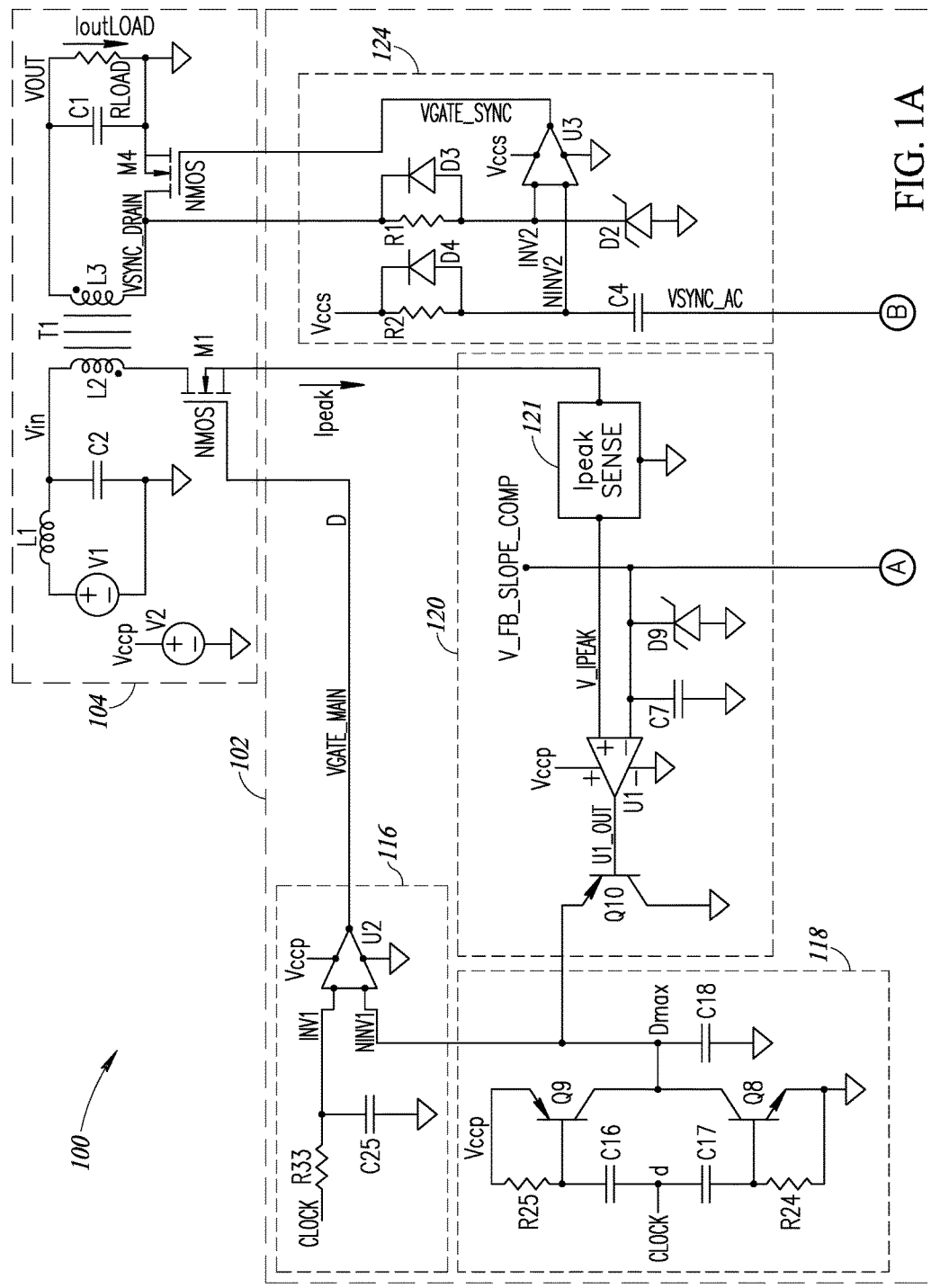
FIGS. 1A-1B are a schematic circuit diagram for a power converter that includes a magnetic peak current control mode (PCMC) controller, according to one illustrated implementation.
Figure 1B:
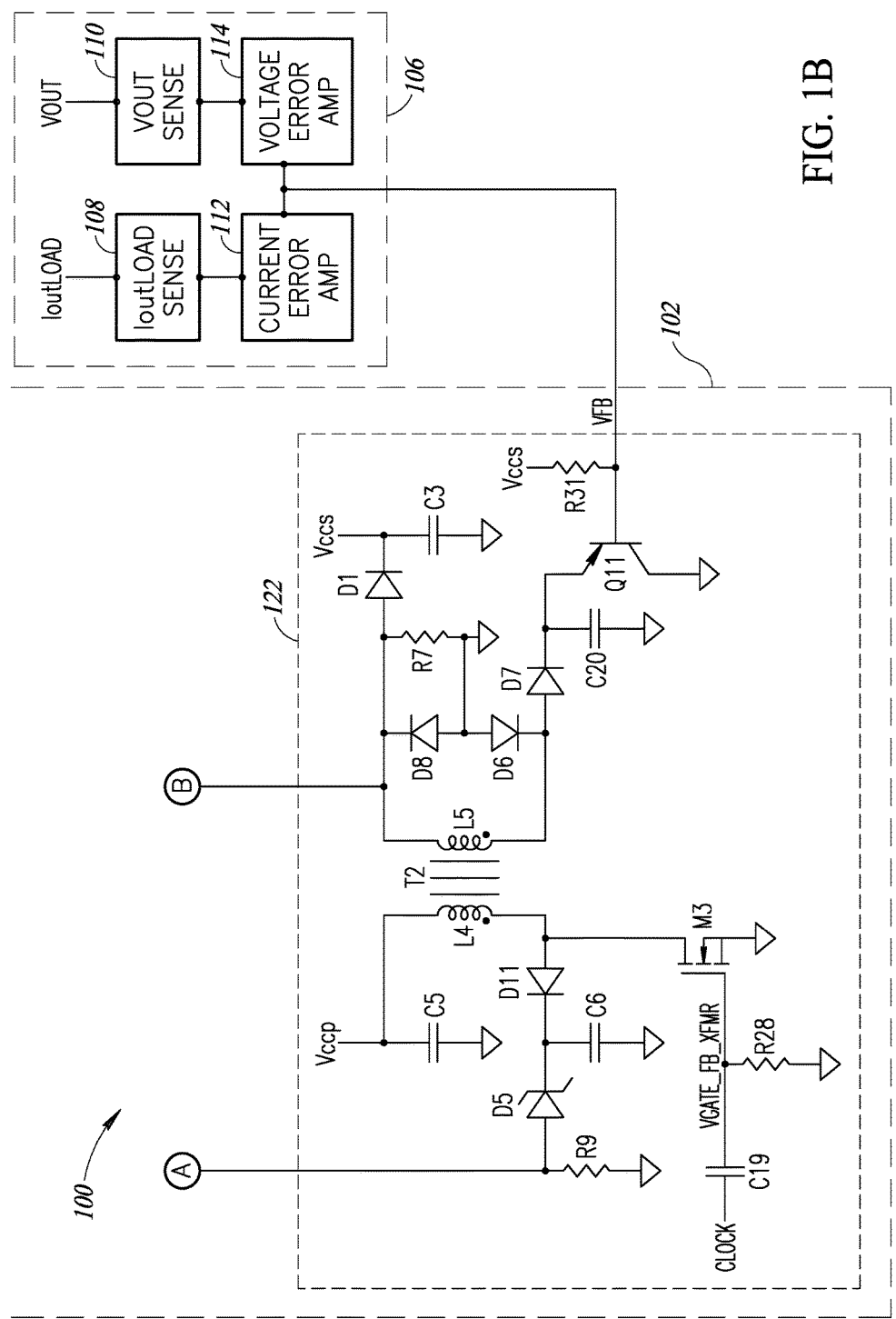

FIGS. 1A-1B show a schematic diagram for a power converter 100 that utilizes a PCMC controller 102 according to an example implementation of the present disclosure. In the illustrated implementation, the power converter 100 is a synchronous flyback converter that utilizes synchronous rectification. However, it should be appreciated that the PCMC controller 102 may be used with other types of power converters as well. Generally, the power converter 100 includes the PCMC controller or control circuitry 102, a power train circuit 104, and an isolated secondary control or feedback circuit 106, also referred to herein as an error control signal circuit. Initially, a discussion of the overall operation of the power converter 100 is provided. Then, the PCMC controller 102 is described in further detail.

In switching power supply circuits employing synchronous rectifiers, the diodes are replaced by power transistors to obtain a lower on-state voltage drop. The synchronous rectifier generally uses n-channel MOSFETs rather than diodes to avoid the turn-on voltage drop of diodes which can be significant for low output voltage power supplies. The transistors are biased to conduct when a diode would have been conducting from anode to cathode, and conversely, are gated to block current when a diode would have been blocking from cathode to anode. Although MOSFETs usually serve this purpose, bipolar transistors and other active semiconductor switches may also be suitable.

In the example power converter 100 of FIGS. 1A-1B, a DC voltage input V1 that provides an input voltage $V_{IN}$ via an input inductor L1 is connected to a primary winding L2 of a transformer T1 by a primary or main switch M1. An input capacitor C2 is provided across the input voltage $V_{IN}$ and a reference node (e.g., ground). In the illustrated implementation, the switch M1 is an NMOS device. An internal primary side voltage source V2 is used to provide a voltage $V_{CCP}$ to various components of the primary side of the power converter 100.

A secondary winding L3 of the transformer T1 is connected to an output lead $V_{OUT}$ through a synchronous rectifier including a MOSFET rectifying device or switch M4. The rectifying device M4 includes a body diode. With the main power switch M1 conducting, the input voltage $V_{IN}$ is applied across the primary winding L2. The secondary winding L3 is oriented in polarity to respond to the primary voltage with a current flow $I_{outLOAD}$ through a load $R_{LOAD}$ connected to the output lead $V_{OUT}$, and back through the MOSFET rectifier device M4 to the secondary winding L3. An output filter capacitor C1 shunts the output of the converter 100.

Conductivity of the rectifier device M4 is controlled by gate drive logic which may be part of or may receive signals from the PCMC controller 102, discussed further below. As shown in FIGS. 1A and 1B, the PCMC controller 102 may include an output control node VGATE_MAIN which provides a PWM drive signal having a duty cycle D to the main switch M1, and a control signal VGATE_SYNC which provides a control signal to the synchronous rectifying device M4.

The isolated secondary control or feedback circuit 106 includes a current sensor circuit 108 that is operative to sense the load current IoutLOAD of the power converter 100. The secondary control circuit 106 additionally or alternatively includes a voltage sensor circuit 110 that is operative to sense the output voltage $V_{OUT}$ of the power converter 100. The current sensor circuit 108 and the voltage sensor circuit 110 may provide a feedback signal VFB (or error control signal) to the PCMC controller 102 via error amplifiers 112 and 114, respectively, as discussed further below. The current sensor circuit 108 and the voltage sensor circuit 110 may be any suitable circuits operative to sense current and voltage, respectively, and may include one or more transformers, one or more resistors, etc.

The PCMC controller 102 includes a time delayed gate drive circuit 116, a preset maximum duty cycle circuit 118, a peak current mode PWM terminator circuit 120 (also referred to herein as a peak current mode detector circuit), a multiple function magnetic isolator circuit 122, and a synchronous gate drive circuit 124. A discussion of each of the components is provided below.

The preset maximum duty cycle circuit 118 is operative to set the maximum allowed duty cycle for the controller 102. The present maximum duty cycle circuit 118 includes complementing bipolar junction transistors (BJTs) Q8 and Q9, resistors R24 and R25, and capacitors C16, C17 and C18. A fixed clock signal input CLOCK from a clock circuit (see FIG. 7) is complemented through the pair of BJTs Q8 and Q9, which sets the maximum duty cycle Dmax. In application, the fixed clock input signal CLOCK has a low duty cycle d (e.g., 20% duty cycle). The maximum allowable duty cycle Dmax for the power converter 100 at the respective collectors of the BJTs Q8 and Q9 is: Dmax=1−d. The duty cycle D of the main switch M1 is provided at the VGATE_MAIN signal output by the time delayed gate drive circuit 116.

The time delayed gate drive circuit 116 includes a main switch gate driver U2 having non-inverting input NINV1, an inverting input INV1, and an output VGATE_MAIN. The time delayed gate drive circuit 116 also includes a resistor R33 coupled to the clock signal CLOCK and the inverting input INV1 of the main switch gate driver U2, and a capacitor C25 coupled between the inverting input INV1 of the main switch gate driver U2 and ground. The resistor R33 and the capacitor C25 of time delayed gate driver circuit 116 comprise a resistor-capacitor (RC) circuit that adjusts the time delay of the clock signal CLOCK into the main switch gate driver U2. Adjusting the time delay changes the dead time between the main switch M1 and the synchronous rectifier switch M4 to prevent shoot through. This time delay is set so that the synchronous rectifier switch M4 is turned off before the main switch M1 is turned on. A truth table for the main switch driver U2 of the time delayed gate drive circuit 116 is shown in a table 200 of FIG. 2.

The peak current mode PWM terminator circuit 120 operates to adjust the duty cycle D of the gate driver U2. The peak current mode PWM terminator circuit 120 includes a peak current sensor circuit 121 (e.g., transformer, resistor) that provides a voltage signal V_IPEAK representative of the peak current Ipeak to a non-inverting input of a comparator U1. The peak current mode PWM terminator circuit 120 also includes a capacitor C7 and a Zener diode D9 coupled to an inverting input of the comparator U1. The output U1_OUT of the comparator U1 is coupled to a base of a BJT Q10. The collector of the BJT Q10 is coupled to ground, and the emitter of the BJT Q10 is coupled to the Dmax node, which is coupled to the non-inverting input NINV1 of the gate driver U2 of the time delayed gate drive circuit 116. The node at the inverting input of the comparator U1 is labeled V_FB_SLOPE_COMP.

Figures 2, 3:
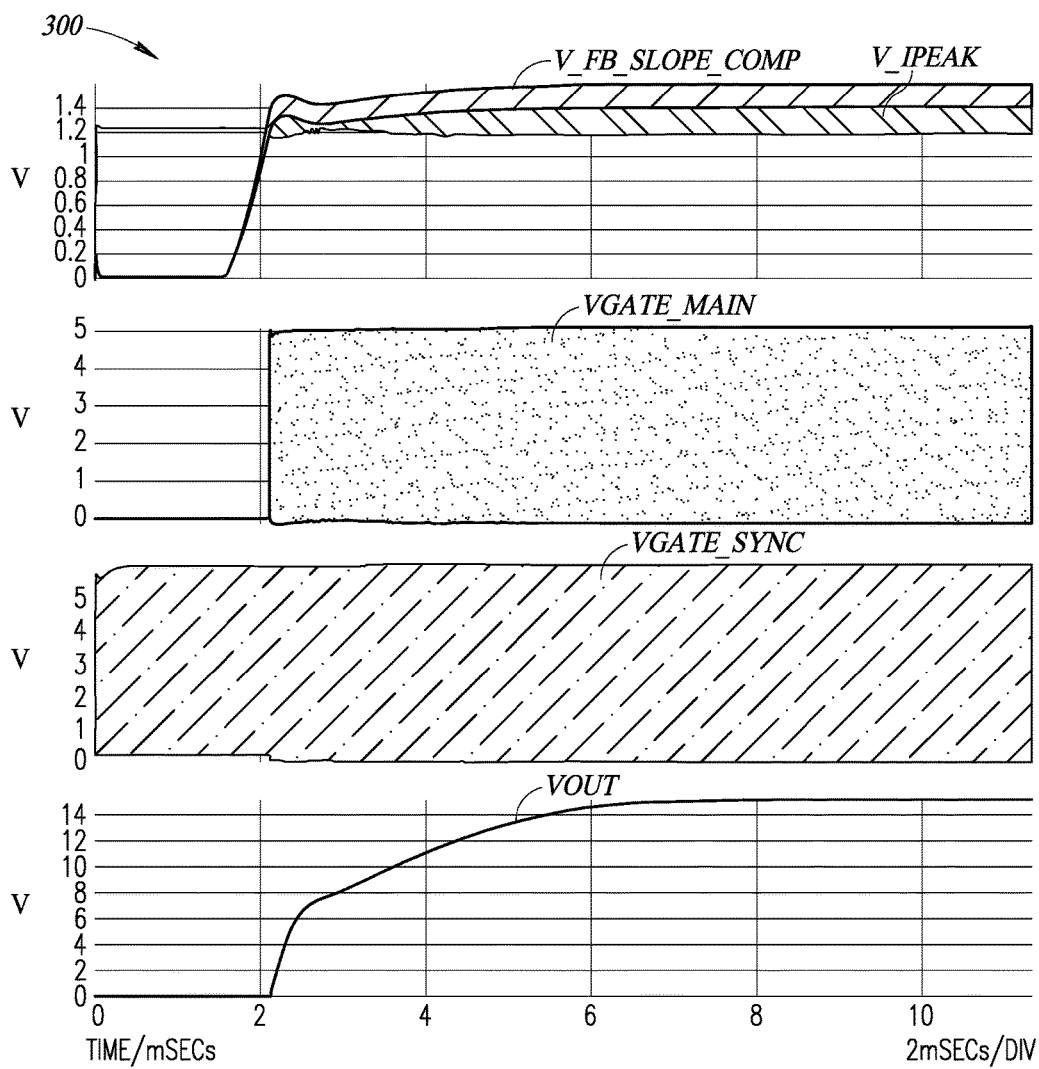
FIG. 2 is a truth table for various MOSFET drivers (U2 and U3) of the PCMC controller of FIGS. 1A-1B, according to one non-limiting illustrated implementation.
FIG. 3 is a graph showing various waveforms of the power converter of FIGS. 1A-1B during a startup operation, according to one illustrated implementation.

In operation, the comparator U1 senses a level shifted peak input current and terminates the PWM signal by turning on the BJT Q10. The table 200 of FIG. 2 is a truth table for the driver U2. When the main switch M1 is conducting, the current sensed via the peak current sensor circuit 121 increases in amplitude. When the current sensed reaches voltage V_FB_SLOPE_COMP, the gate signal VGATE_MAIN is terminated for the cycle. The peak current is limited by the voltage at the Zener diode D9.

The multiple function magnetic isolator circuit 122 is operative to perform multiple functions, discussed further below. The multiple function magnetic isolator circuit 122 comprises an isolation transformer T2 that has a primary side winding L4 coupled to a primary side circuit and a secondary side winding L5 coupled to a secondary side circuit. The multiple function magnetic isolator circuit 122 includes a BJT Q11, a MOSFET switch M3, resistors R7, R9, R28 and R31, capacitors C3, C5, C6, C19 and C20, diodes D1, D6, D7, D8, D11, and Zener diode D5.

The multiple function magnetic isolator circuit 122 magnetically provides a secondary bias voltage supply $V_{CCS}$, returns the voltage and/or current error signal VFB from the secondary side circuit of the power converter 100 to the primary side circuit via the isolation transformer T2, and drives the timed signal for the synchronous gate driver U3 from the primary side circuit to the secondary side circuit of the power converter 100.

The synchronous gate drive circuit 124 is operative to drive the synchronous rectifier switch M4. The synchronous gate drive circuit 124 includes the driver U3, resistors R1 and R2, diodes D3 and D4, capacitor C4, and Zener diode D2.

As noted above, the synchronous rectifier switch M4 is turned on right after the FET body diode conducts the flyback current through the secondary winding L3 of the transformer T1 upon the main switch M1 turning off. The synchronous rectifier switch M4 is turned off by the trailing edge of the clock signal CLOCK received from the magnetic isolator transformer T2 when the FET body diode is forward biased and prior to the main switch M1 turning on. This scheme advantageously achieves zero voltage switching and minimizes the switching loss of the synchronous rectifier switch M4. The Zener voltage at the Zener diode D2 ensures that the synchronous rectifier switch M4 remains turned off while the main switch M1 is turned on, and is therefore immune to any voltage glitches from the drive pulse. The synchronous driver U3 has an inverting input INV2, a non-inverting input NINV2, and an output VGATE_SYNC with logic indicated by the table 200 of FIG. 2.

FIG. 3 includes a plurality of graphs 300 showing various waveforms of the power converter of FIGS. 1A-1B during a startup operation and regulating to a 15 volt output, according to one illustrated implementation. In particular, FIG. 3 shows the error control signal V_FB_SLOPE_COMP, the peak current signal V_IPEAK, the main switch gate signal VGATE_MAIN, the synchronous rectifier switch gate signal VGATE_SYNC, and the output voltage signal VOUT.

Figure 4:
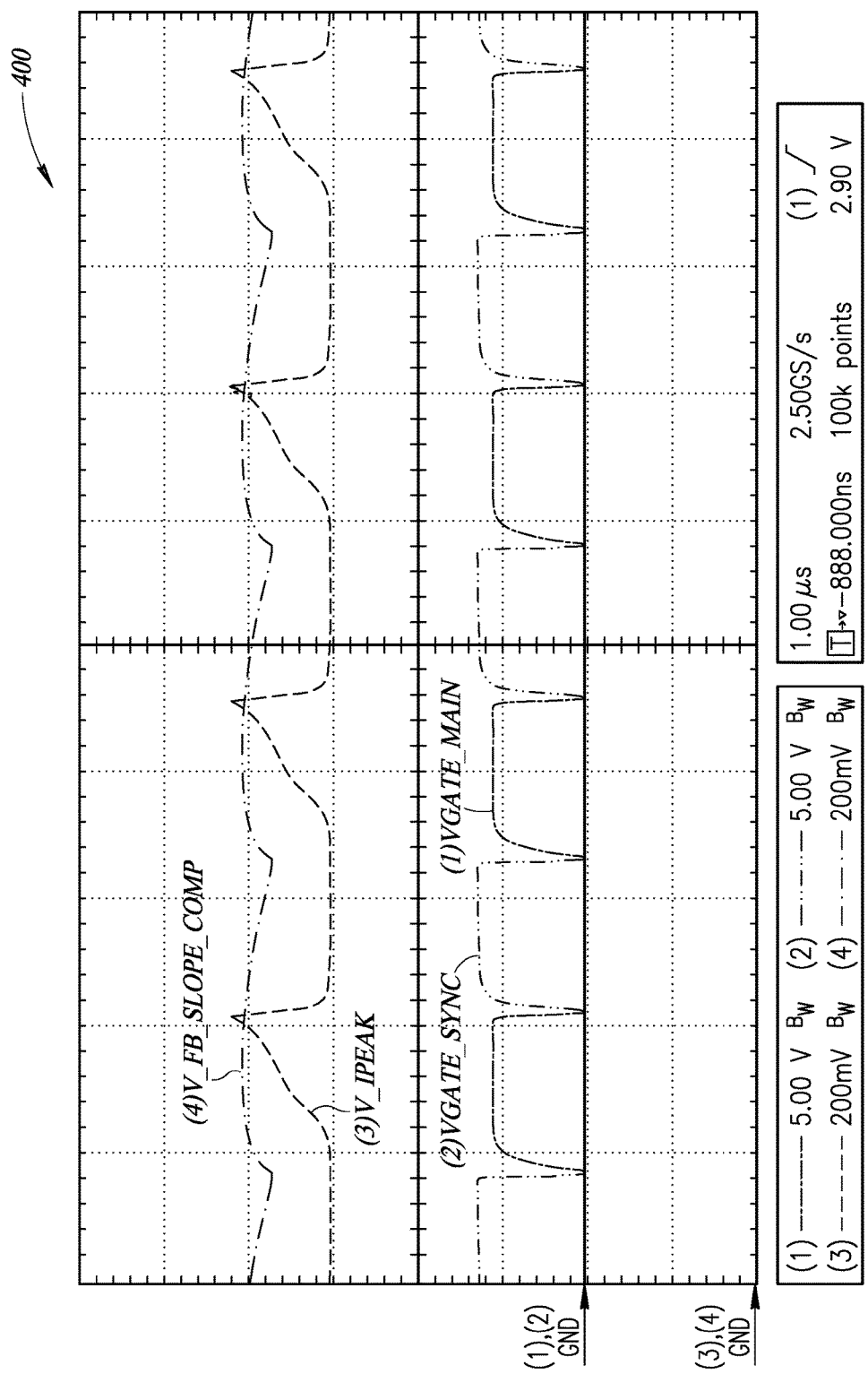
FIG. 4 is a graph showing a zoomed in view of an error control signal, a peak current signal, a main switch gate signal, and a synchronous rectifier switch gate signal, for an input voltage of 16 volts, according to one non-limiting illustrated implementation.

FIG. 4 is a graph 400 that shows a zoomed in view of the error control signal V_FB_SLOPE_COMP, the peak current signal V_IPEAK, the main switch gate signal VGATE_MAIN, and the synchronous rectifier switch gate signal VGATE_SYNC, which shows the gating control. The input voltage is 16 V for the graph 400 of FIG. 4. The main switch gate signal VGATE_MAIN terminates immediately when the peak current signal V_IPEAK crosses the error control signal VFB_SLOPE_COMP. To prevent subharmonic oscillation above 50% duty cycle, the error control or feedback signal V_FB_SLOPE_COMP includes a built-in ramp for slope-compensation via discharge of the capacitor C7 by the resistor R9.

Figure 5:
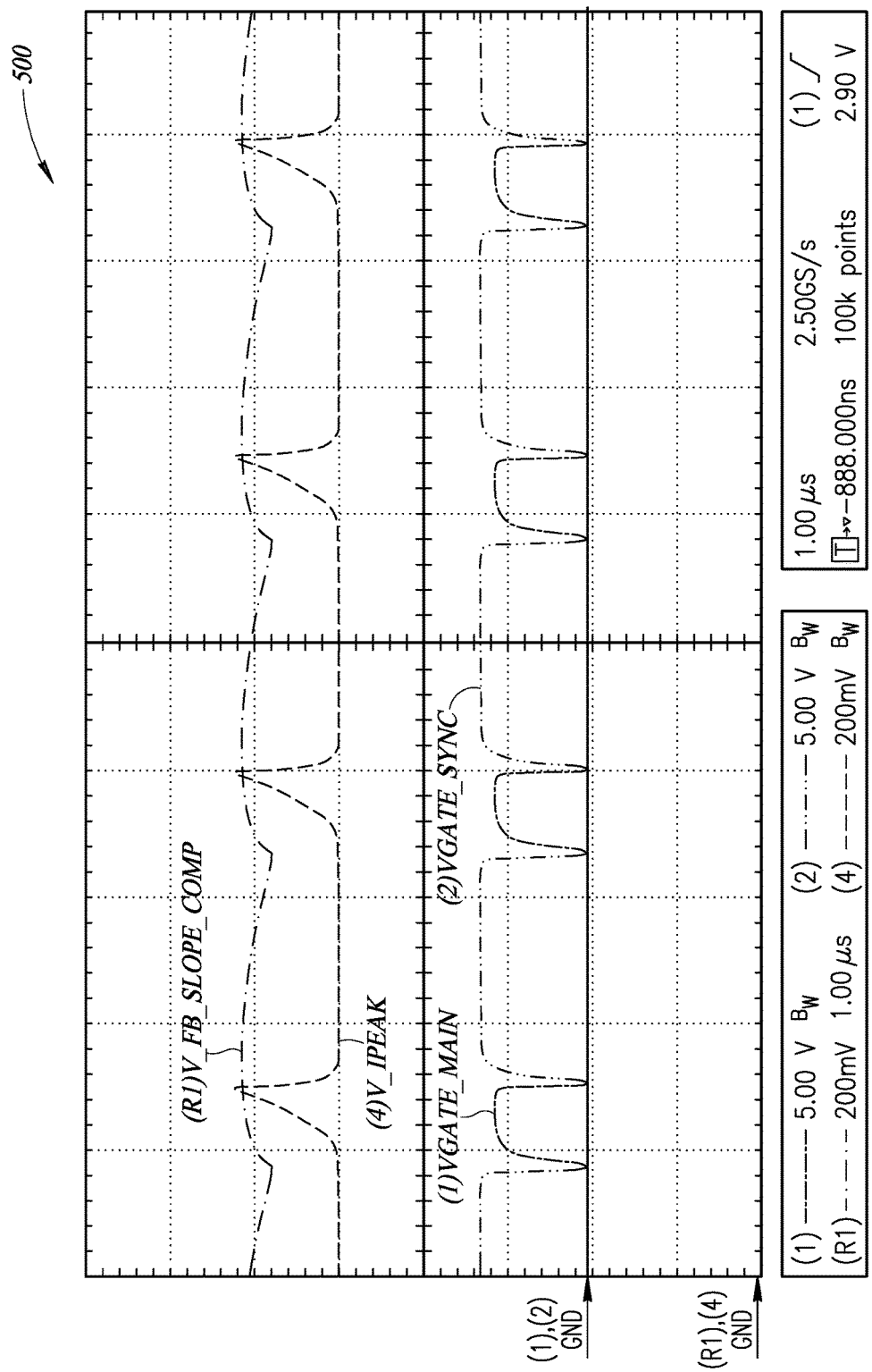
FIG. 5 is a graph that shows a zoomed in view of the error control signal, the peak current signal, the main switch gate signal, and the synchronous rectifier switch gate signal, for an input voltage of 42 volts, according to one non-limiting illustrated implementation.

FIG. 5 is a graph 500 that shows a zoomed in view of the error control signal V_FB_SLOPE_COMP, the peak current signal V_IPEAK, the main switch gate signal VGATE_MAIN, and the synchronous rectifier switch gate signal VGATE_SYNC for an input voltage of 42 V.

Figure 6:
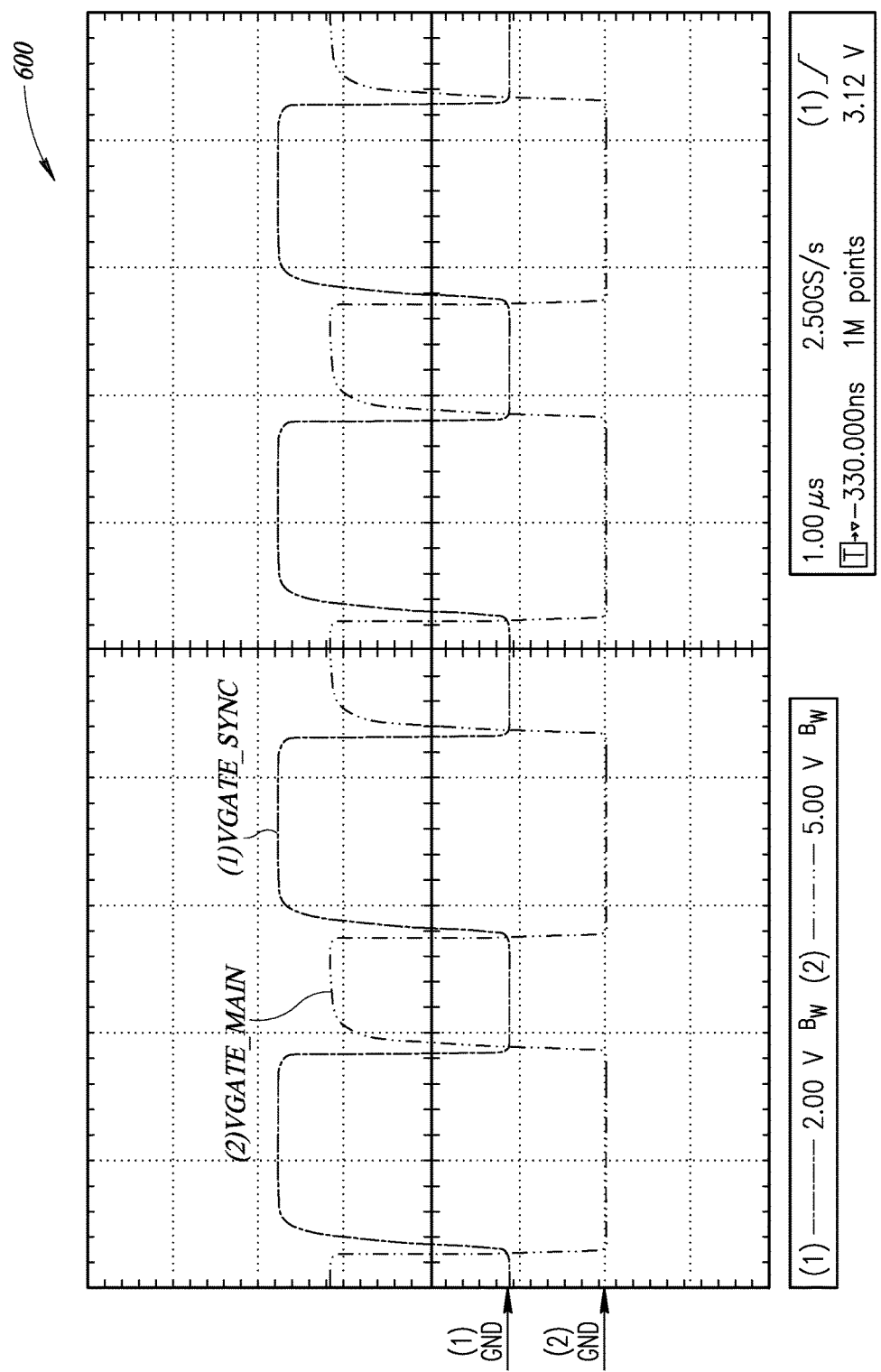
FIG. 6 is a graph that shows the main switch gate signal and the synchronous rectifier switch gate signal, according to one non-limiting illustrated implementation.

FIG. 6 is a graph 600 that shows the main switch gate signal VGATE_MAIN and the synchronous rectifier switch gate signal VGATE_SYNC. The graph 600 illustrates the dead time between the turn-off of the synchronous rectifier switch M4 and before turning on of the main switch M1.

Likewise, the main switch M1 is turned off before the synchronous rectifier switch M4 is turned on. This is achieved by the time delayed gate drive circuit 116, discussed above. As noted above, this feature prevents shoot-through that would be caused by the concurrent conduction of both switches M1 and M4.

Figure 7:
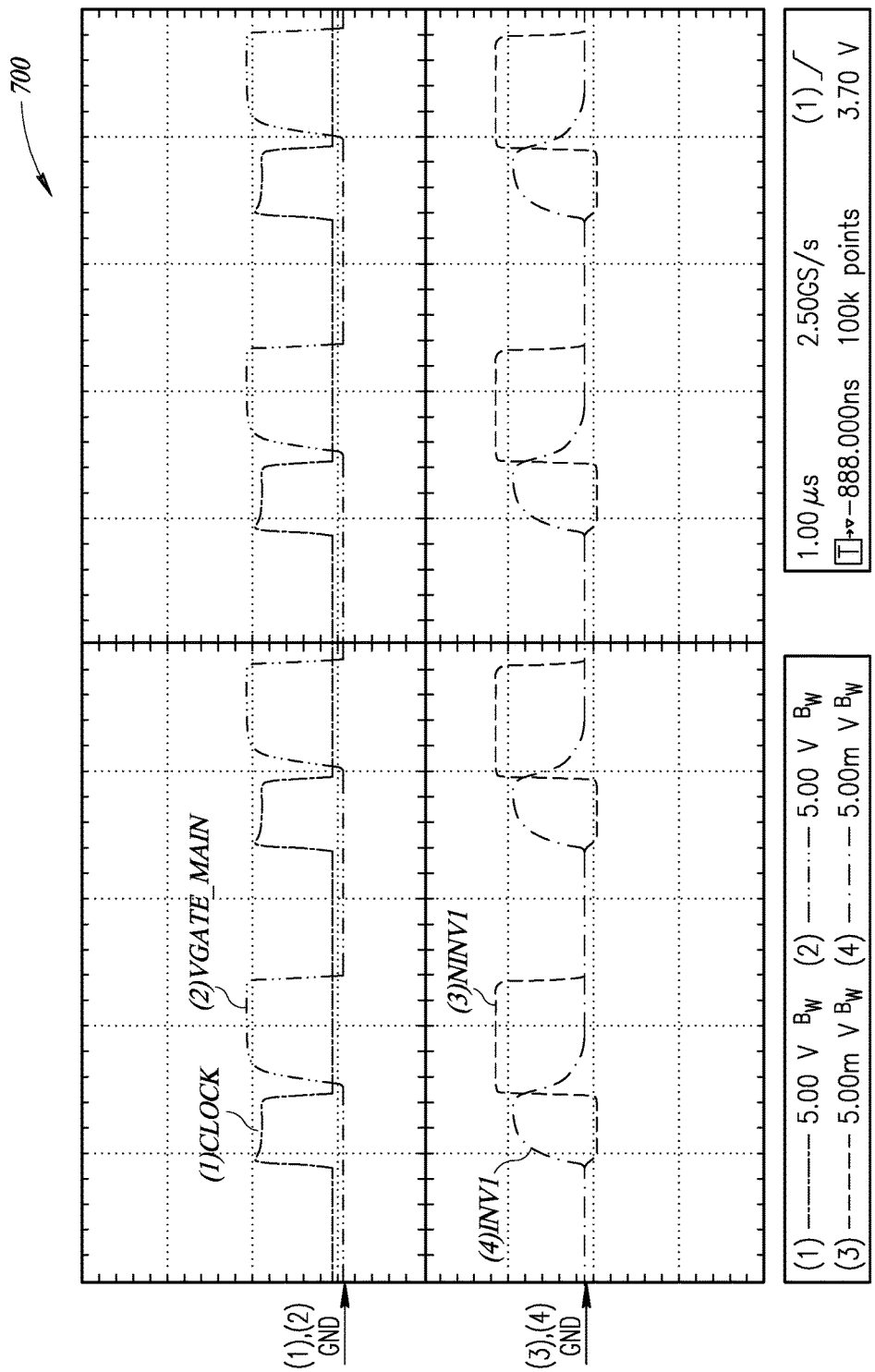
FIG. 7 is a graph that shows the main switch gate signal, a clock signal, a non-inverting input signal for a comparator of a time delayed gate drive circuit, and an inverting input signal for the time delayed gate drive circuit, for an input voltage of 28 V, according to one non-limiting illustrated implementation.
Figure 8:
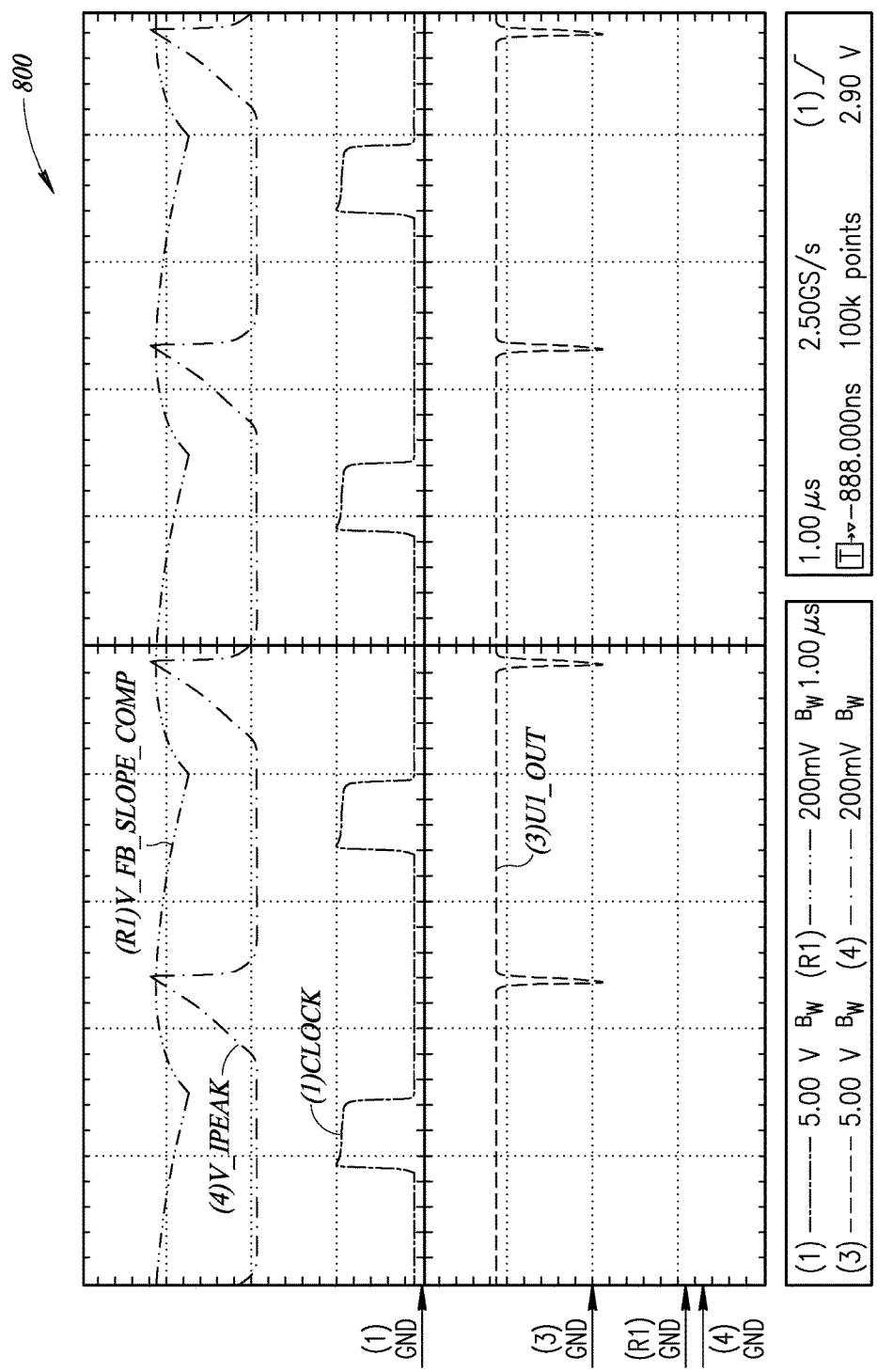
FIG. 8 is a graph that shows the error control signal, the peak current signal, the clock signal, and the output signal of a comparator of a peak current mode PWM terminator circuit, according to one non-limiting illustrated implementation.
Figure 9:
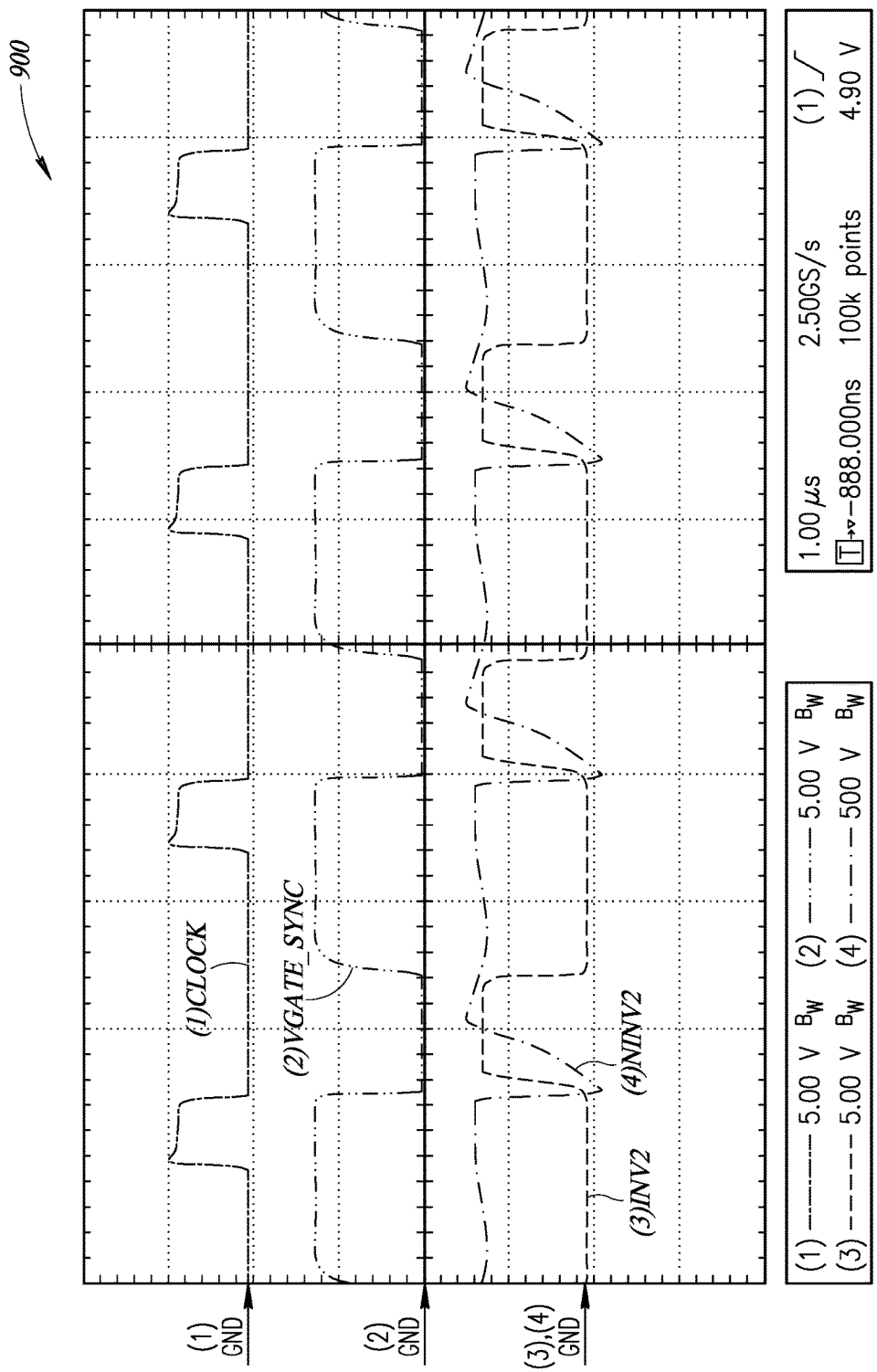
FIG. 9 is a graph that shows the synchronous rectifier switch gate signal, the clock signal, an inverting input signal of a comparator of a synchronous gate drive circuit, and a non-inverting input signal of the comparator of the synchronous gate drive circuit, according to one non-limiting illustrated implementation.

FIG. 7 is a graph 700 that shows the main switch gate signal VGATE_MAIN, the clock signal CLOCK, the non-inverting input signal NINV1 for the gate driver U2 of the time delayed gate drive circuit 116, and the inverting input signal INV1 for the gate driver U2, for an input voltage of 28 V. FIG. 8 is a graph 800 that shows the error control signal V_FB_SLOPE_COMP, the peak current signal V_IPEAK, the clock signal CLOCK, and the output signal U1_OUT of the comparator U1 of the peak current detector circuit 120. FIG. 9 is a graph 900 that shows the synchronous rectifier switch gate signal VGATE_SYNC, the clock signal CLOCK, the inverting input signal INV2 of the gate driver U3 of the synchronous gate drive circuit 124, and the non-inverting input signal NINV2 of the gate driver U3. As can be seen from the graphs 700, 800, and 900, the clock signal CLOCK provides the operating frequency for the converter 100 and provides all of the timing references. The main switch M1 turns on, via the main switch gate signal VGATE_MAIN, only during the falling edge of the clock signal CLOCK and terminates when the peak current signal V_IPEAK crosses the error control signal V_FB_SLOPE_COMP.

Advantageously, one or more implementations discussed herein achieve synchronous flyback through the use of analog devices and minimal integrated circuits. This provides full control and ownership of the design, and selection of parts that allows for a wide variety of configurations, including configurations that provide various output power ranges and various levels of radiation hardness.

In at least some implementations, the use of discrete components to control the timing of synchronous rectification in a flyback technology is provided. As discussed above, the delay between the main switch and the synchronous rectifier switch may be provided by the trailing edge of a clock pulse for turning off the synchronous rectifier switch prior to turning on the main switch. In at least some implementations, the PWM controller with synchronous drive capability can operate with input voltages of 8 volts, or even lower voltages. Further, in at least some implementations, analog latch peak current mode control is achieved without use of a digital flip-flop. This may be further enhanced by use of a single comparator with a preset maximum duty cycle set by analog components, as described above. Moreover, in at least some implementations, the power converter 100 may operate at high frequencies (e.g., 400 kHz or more).

The foregoing detailed description has set forth various implementations of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one implementation, the present subject matter may be implemented via Application Specific Integrated Circuits (ASICs). However, those skilled in the art will recognize that the implementations disclosed herein, in whole or in part, can be equivalently implemented in standard integrated circuits, as one or more computer programs running on one or more computers, as firmware, or as virtually any combination thereof, and that designing the circuitry and/or writing the code for the software and or firmware would be well within the skill of one of ordinary skill in the art in light of this disclosure.

Those of skill in the art will recognize that many of the methods or algorithms set out herein may employ additional acts, may omit some acts, and/or may execute acts in a different order than specified.

In addition, those skilled in the art will appreciate that the mechanisms taught herein are capable of being distributed as a program product in a variety of forms, and that an illustrative implementation applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory.

The various implementations described above can be combined to provide further implementations. These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A peak current mode control (PCMC) controller for a power converter, the power converter comprising a main transformer having a primary winding and a secondary winding, the primary winding electrically coupleable to an input voltage node and electrically coupled to a main switch, the secondary winding electrically coupleable to an output voltage node and electrically coupled to a synchronous rectifier switch, the PCMC controller comprising:

a peak current detector circuit having a first input node operatively coupled to a current sensor circuit that, in operation, senses a current of the power converter, a second input node operatively coupled to an error control signal circuit, and an output node that provides a peak current detector output signal usable at least in part to control the operation of the main switch, in operation the peak current detector circuit compares a current sensor signal received from the current sensor circuit to an error control signal received from the error control signal circuit and, responsive to detecting that the current sensor signal exceeds the error control signal, changes the state of the peak current detector output signal;

a magnetic isolator circuit comprising an isolation transformer comprising a primary winding and a secondary winding, the magnetic isolator circuit comprising a first input node operatively coupled to the error control signal circuit, a second input node operatively coupled to a clock circuit to receive a clock signal therefrom, a first output node electrically coupled to the second input node of the peak current detector circuit to provide the error control signal to the peak current detector circuit, and a second output node electrically coupled to the secondary winding of the isolation transformer; and a synchronous gate drive circuit comprising a first input node operatively coupled to the secondary winding of the main transformer, a second input node operatively coupled to the second output node of the magnetic isolator circuit, and an output node operatively coupled to control the operation of the synchronous rectifier switch.

2. The PCMC controller of claim 1 wherein the peak current detector circuit comprises a comparator and the synchronous gate drive circuit comprises a MOSFET driver.

3. The PCMC controller of claim 1 wherein the magnetic isolator circuit includes circuitry that provides a voltage source for the secondary side circuit of the PCMC controller.

4. The PCMC controller of claim 1, further comprising:
a time delayed gate drive circuit comprising a first input node operatively coupled to the clock circuit to receive the clock signal therefrom, a second input node operatively coupled to the output node of the peak current detector circuit, and an output node operatively coupled to control the operation of the main switch based at least in part on the clock signal and the peak current detector output signal, in operation, the time delayed gate drive circuit causes main switch to turn on only after the synchronous rectifier switch has turned off during a switching cycle.

5. The PCMC controller of claim 4 wherein the time delayed gate drive circuit comprises a resistor-capacitor (RC) circuit.

6. The PCMC controller of claim 4 wherein the time delayed gate drive circuit comprises a MOSFET gate driver.

7. The PCMC controller of claim 4, further comprising:
a preset maximum duty cycle circuit comprising an input node operatively coupled to the clock circuit to receive the clock signal therefrom, and an output node operatively coupled to the second input node of the time delayed gate drive circuit, in operation, the present maximum duty cycle sets a maximum duty cycle for the main switch of the power converter.

8. The PCMC controller of claim 7 wherein the preset maximum duty cycle circuit comprises first and second complementing bipolar junction transistors.

9. The PCMC controller of claim 1 wherein the magnetic isolator circuit comprises a magnetic isolator circuit switch operatively coupled to the primary winding of the isolation transformer, and wherein the second input node of the magnetic isolator circuit is operatively coupled to control the operation of the synchronous rectifier switch.

10. The PCMC controller of claim 1 wherein the synchronous gate drive circuit is operative to cause the synchronous rectifier switch to turn on after the main switch turns off each cycle, and to cause the synchronous rectifier switch to turn off before the main switch turns on during a subsequent cycle.

11. The PCMC controller of claim 1, further comprising:
the current sensor circuit comprising a current transducer that, in operation, senses a current of the power converter.

12. The PCMC controller of claim 11 wherein the current transducer comprises a transformer or a resistor.

13. A power converter, comprising:
a transformer having a primary winding and a secondary winding, the primary winding electrically coupleable to an input voltage node and the secondary winding electrically coupleable to an output voltage node;
a primary circuit electrically coupled to the primary winding, the primary circuit comprising a main switch;
a secondary circuit electrically coupled to the secondary winding, the primary circuit comprising a synchronous rectifier switch; and
a peak current mode control (PCMC) controller, comprising:

a peak current detector circuit having a first input node operatively coupled to a current sensor circuit that, in operation, senses a current of the power converter, a second input node operatively coupled to an error control signal circuit, and an output node that provides a peak current detector output signal usable at least in part to control the operation of the main switch, in operation the peak current detector circuit compares a current sensor signal received from the current sensor circuit to an error control signal received from the error control signal circuit and, responsive to detecting that the current sensor signal exceeds the error control signal, changes the state of the peak current detector output signal;
a magnetic isolator circuit comprising an isolation transformer comprising a primary winding and a secondary winding, the magnetic isolator circuit comprising a first input node operatively coupled to the error control signal circuit, a second input node operatively coupled to a clock circuit to receive a clock signal therefrom, a first output node electrically coupled to the second input node of the peak current detector circuit to provide the error control signal to the peak current detector circuit, and a second output node electrically coupled to the secondary winding of the isolation transformer; and
a synchronous gate drive circuit comprising a first input node operatively coupled to the secondary winding of the main transformer, a second input node operatively coupled to the second output node of the magnetic isolator circuit, and an output node operatively coupled to control the operation of the synchronous rectifier switch.

14. The power converter of claim 13 wherein the peak current detector circuit comprises a comparator and the synchronous gate drive circuit comprises a MOSFET driver.

15. The power converter of claim 13 wherein the magnetic isolator circuit includes circuitry that provides a voltage source for the secondary side of the PCMC controller.

16. The power converter of claim 13, further comprising:
a time delayed gate drive circuit comprising a first input node operatively coupled to the clock circuit to receive the clock signal therefrom, a second input node operatively coupled to the output node of the peak current detector circuit, and an output node operatively coupled to control the operation of the main switch based at least in part on the clock signal and the peak current detector output signal, in operation, the time delayed gate drive circuit causes main switch to turn on only after the synchronous rectifier switch has turned off during a switching cycle.

17. The power converter of claim 16 wherein the time delayed gate drive circuit comprises a resistor-capacitor (RC) circuit.

18. The power converter of claim 16, further comprising:
a preset maximum duty cycle circuit comprising an input node operatively coupled to the clock circuit to receive the clock signal therefrom, and an output node operatively coupled to the second input node of the time delayed gate drive circuit, in operation, the present maximum duty cycle sets a maximum duty cycle for the main switch of the power converter.

19. The power converter of claim 18 wherein the preset maximum duty cycle circuit comprises first and second complementing bipolar junction transistors.

20. The power converter of claim 13 wherein the magnetic isolator circuit comprises a magnetic isolator circuit switch operatively coupled to the primary winding of the isolation transformer, and wherein the second input node of the magnetic isolator circuit is operatively coupled to control the operation of the synchronous rectifier switch.

21. The power converter of claim 13 wherein the synchronous gate drive circuit is operative to cause the synchronous rectifier switch to turn on after the main switch turns off each cycle, and causes the synchronous rectifier switch to turn off before the main switch turns on for a subsequent cycle.

22. The power converter of claim 13, further comprising:
the current sensor circuit comprising a current transducer that, in operation, senses a current of the power converter.

23. The power converter of claim 22 wherein the current transducer comprises a transformer or a resistor.

24. A peak current mode control (PCMC) controller for a power converter, the power converter comprising a main transformer having a primary winding and a secondary winding, the primary winding electrically coupleable to an input voltage node and electrically coupled to a main switch, the secondary winding electrically coupleable to an output voltage node and electrically coupled to a synchronous rectifier switch, the PCMC controller comprising:
a magnetic isolator circuit comprising an isolation transformer comprising a primary winding electrically coupled to a primary side circuit and a secondary winding electrically coupled to a secondary side circuit, the magnetic isolator circuit comprising circuitry that, in operation, provides a voltage supply to the secondary side circuit, provides an error control signal from the secondary side circuit to the primary side circuit, and provides an output signal usable by a synchronous gate drive circuit to control the operation of the synchronous rectifier switch.

* * * * *